(12) United States Patent
Tran et al.

(10) Patent No.: US 10,847,227 B2
(45) Date of Patent: Nov. 24, 2020

(54) CHARGE PUMP FOR USE IN NON-VOLATILE FLASH MEMORY DEVICES

(71) Applicant: Silicon Storage Technology, Inc., San Jose, CA (US)

(72) Inventors: Hieu Van Tran, San Jose, CA (US); Anh Ly, San Jose, CA (US); Thuan Vu, San Jose, CA (US); Kha Nguyen, Ho Chi Minh (VN); Hien Pham, Ho Chi Minh (VN); Stanley Hong, San Jose, CA (US); Stephen T. Trinh, San Jose, CA (US)

(73) Assignee: Silicon Storage Technology, Inc., San Jose, CA (US)

(*) Notice: Subject to any disclaimer, the term of this patent is extended or adjusted under 35 U.S.C. 154(b) by 0 days.

(21) Appl. No.: 16/219,424

(22) Filed: Dec. 13, 2018

(65) Prior Publication Data
US 2020/0118632 A1 Apr. 16, 2020

Related U.S. Application Data

(60) Provisional application No. 62/746,408, filed on Oct. 16, 2018.

(51) Int. Cl.
*G11C 11/34* (2006.01)
*G11C 16/14* (2006.01)
*H02M 3/07* (2006.01)
*G11C 16/30* (2006.01)

(52) U.S. Cl.
CPC ........... *G11C 16/14* (2013.01); *G11C 16/30* (2013.01); *H02M 3/073* (2013.01); *H02M 2003/076* (2013.01)

(58) Field of Classification Search
USPC ................................................. 365/185.18
See application file for complete search history.

(56) References Cited

U.S. PATENT DOCUMENTS

| | | | |
|---|---|---|---|
| 4,935,644 A * | 6/1990 | Tsujimoto | H02M 3/073 327/536 |
| 5,029,130 A | 7/1991 | Yeh | |
| 5,406,517 A | 4/1995 | Chang et al. | |

(Continued)

FOREIGN PATENT DOCUMENTS

KR    2009 0071860    7/2009

OTHER PUBLICATIONS

Jiang et al, "High-Efficiency Charge Pump for Low-Power On-Chip Applications", Mar. 2018, IEEE Transactions on Circuits & Systems, vol. 65, No. 3, pp. 1143-1153. (Year: 2018).*

*Primary Examiner* — Viet Q Nguyen
(74) *Attorney, Agent, or Firm* — DLA Piper LLP US

(57) ABSTRACT

Numerous embodiments of an improved charge pump design are disclosed for generating the high voltages necessary to perform erase and program operations in non-volatile flash memory devices. In these embodiments, each boost stage in the charge pump is modified to overcome a deficiency in prior art charge pumps whereby voltage actually would decrease in the final boost stage. These modifications include the addition of one or more of a clock doubling circuit, a local self-precharge circuit, a feed-forward precharge circuit, a feed-backward precharge circuit, and a hybrid circuit comprising NMOS and PMOS transistors and diodes.

24 Claims, 19 Drawing Sheets

(56) References Cited

U.S. PATENT DOCUMENTS

| | | | |
|---|---|---|---|
| 5,982,223 A | 11/1999 | Park et al. | |
| 6,175,264 B1 * | 1/2001 | Jinbo | G11C 5/145 327/534 |
| 6,191,642 B1 | 2/2001 | Nguyen | |
| 6,661,682 B2 * | 12/2003 | Kim | H02M 3/073 307/110 |
| 6,677,806 B2 * | 1/2004 | Bloch | H02M 3/073 327/536 |
| 6,747,310 B2 | 6/2004 | Fan et al. | |
| 6,831,499 B2 | 12/2004 | Oddone | |
| 6,867,638 B2 * | 3/2005 | Saiki | H02M 3/07 327/536 |
| 7,176,746 B1 * | 2/2007 | Wang | H02M 3/073 326/113 |
| 7,362,084 B2 * | 4/2008 | Tran | G11O 5/145 307/43 |
| 7,403,418 B2 * | 7/2008 | Lin | G11C 16/08 365/185.11 |
| 7,446,596 B1 * | 11/2008 | Fort | H02M 3/073 327/536 |
| 7,602,233 B2 * | 10/2009 | Pietri | H02M 3/073 327/536 |
| 7,652,522 B2 * | 1/2010 | Racape | G11C 5/145 327/536 |
| 7,683,699 B2 * | 3/2010 | Fort | H02M 3/073 327/536 |
| 7,737,765 B2 * | 6/2010 | Tran | H02M 1/44 327/536 |
| 7,741,898 B2 * | 6/2010 | Hsu | H02M 3/073 327/536 |
| 7,969,239 B2 * | 6/2011 | Van Tran | H02M 3/07 327/564 |
| 8,232,833 B2 * | 7/2012 | Tran | H02M 3/073 327/536 |
| 8,811,093 B2 * | 8/2014 | Tran | G11C 16/0425 365/185.29 |
| 8,867,281 B2 * | 10/2014 | Tran | H02M 3/073 365/185.33 |
| 9,222,715 B2 * | 12/2015 | Lee | F25D 11/006 |
| 9,531,262 B2 * | 12/2016 | Peppiette | H02M 3/073 |
| 9,634,562 B1 | 4/2017 | Rana | |
| 10,050,524 B1 * | 8/2018 | Rana | H01L 27/0623 |
| 2002/0122324 A1 * | 9/2002 | Kim | H02M 3/073 363/59 |
| 2005/0248386 A1 | 11/2005 | Pan | |
| 2005/0254313 A1 | 11/2005 | Kurihara | |
| 2005/0264343 A1 * | 12/2005 | Nakamura | H02M 3/073 327/536 |
| 2006/0279352 A1 | 12/2006 | Kim | |
| 2007/0229146 A1 * | 10/2007 | Fukuda | H02M 3/073 327/536 |
| 2008/0122506 A1 * | 5/2008 | Racape | G11C 16/30 327/157 |
| 2008/0174360 A1 * | 7/2008 | Hsu | H02M 3/073 327/536 |
| 2009/0206916 A1 * | 8/2009 | Dreibelbis | H02M 3/07 327/536 |
| 2009/0219077 A1 * | 9/2009 | Pietri | H02M 3/073 327/536 |
| 2010/0097125 A1 * | 4/2010 | Ji | H02M 3/073 327/536 |
| 2010/0283533 A1 * | 11/2010 | Li | H02M 3/073 327/536 |
| 2020/0044564 A1 * | 2/2020 | Shin | G11C 16/32 |

* cited by examiner

CHARGE PUMP FOR USE IN NON-VOLATILE FLASH MEMORY DEVICES

PRIORITY CLAIM

This application claims priority to U.S. Provisional Patent Application No. 62/746,408, titled "Improved Charge Pump for Use in Non-Volatile Flash Memory Devices," filed on Oct. 16, 2018, which is incorporated by reference herein.

TECHNICAL FIELD

Numerous embodiments of an improved charge pump design are disclosed for generating the high voltages necessary to perform erase and program operations in non-volatile flash memory devices. In these embodiments, each boost stage in the charge pump is modified to overcome a deficiency in prior art charge pumps whereby voltage actually would decrease in the final boost stage.

BACKGROUND OF THE INVENTION

Digital non-volatile memories are well known. For example, U.S. Pat. No. 5,029,130 ("the '130 patent") discloses an array of split gate non-volatile memory cells, which are a type of flash memory cells, and is incorporated herein by reference for all purposes. Such a memory cell 110 is shown in FIG. 1. Each memory cell 110 includes source region 14 and drain region 16 formed in a semiconductor substrate 12, with a channel region 18 there between. A floating gate 20 is formed over and insulated from (and controls the conductivity of) a first portion of the channel region 18, and over a portion of the source region 14. A word line terminal 22 (which is typically coupled to a word line) has a first portion that is disposed over and insulated from (and controls the conductivity of) a second portion of the channel region 18, and a second portion that extends up and toward floating gate 20. Floating gate 20 and word line terminal 22 are insulated from the substrate 12 by a gate oxide. Bitline 24 is coupled to drain region 16.

Memory cell 110 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 110 is programmed (where electrons are placed on the floating gate) by placing a positive voltage on the word line terminal 22, and a positive voltage on the source region 14. Electrons will flow from the source region 14 towards the drain region 16. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 110 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 110 for performing read, erase, and program operations:

TABLE No. 1

Operation of Flash Memory Cell 110 of FIG. 1

|  | WL | BL | SL |
|---|---|---|---|
| Read | 2-3 V | 0.6-2 V | 0 V |
| Erase | ~11-13 V | 0 V | 0 V |
| Program | 1-2 V | 1-3 µA | 9-10 V |

Other split gate memory cell configurations, which are other types of flash memory cells, are known. For example, FIG. 2 depicts a four-gate memory cell 210 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes). Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage ranges that can be applied to the terminals of memory cell 310 for performing read, erase, and program operations:

TABLE No. 2

Operation of Flash Memory Cell 210 of FIG. 2

|  | WL/SG | BL | CG | EG | SL |
|---|---|---|---|---|---|
| Read | 1.0-2 V | 0.6-2 V | 0-2.6 V | 0-2.6 V | 0 V |
| Erase | −0.5 V/0 V | 0 V | 0 V/−8 V | 8-12 V | 0 V |
| Program | 1 V | 1 µA | 8-11 V | 4.5-9 V | 4.5-5 V |

FIG. 3 depicts a three-gate memory cell 310, which is another type of flash memory cell. Memory cell 310 is identical to the memory cell 210 of FIG. 2 except that memory cell 310 does not have a separate control gate. The erase operation (whereby erasing occurs through use of the erase gate) and read operation are similar to that of the memory cell 210 except there is no control gate bias applied. The programming operation also is done without the control gate bias, and as a result, a higher voltage must be applied on the source line during a program operation to compensate for a lack of control gate bias.

Table No. 3 depicts typical voltage ranges that can be applied to the terminals of memory cell 310 for performing read, erase, and program operations:

TABLE No. 3

Operation of Flash Memory Cell 310 of FIG. 3

|  | WL/SG | BL | EG | SL |
|---|---|---|---|---|
| Read | 0.7-2.2 V | 0.6-2 V | 0-2.6 V | 0 V |
| Erase | −0.5 V/0 V | 0 V | 11.5 V | 0 V |
| Program | 1 V | 2-3 µA | 4.5 V | 7-9 V |

FIG. 4 depicts stacked gate memory cell 410, which is another type of flash memory cell. Memory cell 410 is similar to memory cell 110 of FIG. 1, except that floating gate 20 extends over the entire channel region 18, and control gate 22 (which here will be coupled to a word line) extends over floating gate 20, separated by an insulating layer (not shown). The erase, programming, and read operations operate in a similar manner to that described previously for memory cell 110.

Table No. 4 depicts typical voltage ranges that can be applied to the terminals of memory cell 410 and substrate 12 for performing read, erase, and program operations:

TABLE No. 4

Operation of Flash Memory Cell 410 of FIG. 4

|  | CG | BL | SL | Substrate |
|---|---|---|---|---|
| Read | 2-5 V | 0.6-2 V | 0 V | 0 V |
| Erase | −8 to −10 V/0 V | FLT | FLT | 8-10 V/15-20 V |
| Program | 8-12 V | 3-5 V | 0 V | 0 V |

FIG. 5 depicts a typical prior art architecture for a two-dimensional prior art flash memory system. Die 500 comprises: memory array 501 and memory array 502 each for storing data, each memory array 501 and 502 comprising rows and columns of memory cells, where each memory cell optionally is of one of the types shown in FIG. 1 as memory cell 110, in FIG. 2 as memory cell 210, in FIG. 3 as memory cell 310, and in FIG. 4 as memory cell 410; pad 503 and pad 504 for enabling electrical communication between the other components of die 500 and, typically, wire bonds (not shown) that in turn connect to pins (not shown) or package bumps that are used to access die 500 from outside of the packaged die 500; high voltage circuit 505 used to provide positive and negative voltage supplies for the flash memory system; control logic 506 for providing various control functions, such as redundancy and built-in self-testing; analog logic 507; a plurality of sensing circuits 508 and 509 used to read data from memory array 501 and memory array 502, respectively; row decoder circuit 510 and row decoder circuit 511, each denoted XDEC, used to access selected rows in memory array 501 and memory array 502, respectively, to be read from or written to; column decoder 512 and column decoder 513, each denoted YMUX, used to access the selected columns in memory array 501 and memory array 502, respectively, to be read from or written to; charge pump circuit 514 and charge pump circuit 515, used to provide increased voltages for program and erase operations for memory array 501 and memory array 502, respectively; high voltage driver circuit 516, denoted NCG, shared by memory array 501 and memory array 502 for read and write (erase/program) operations; high voltage driver circuit 517, denoted WSHDRHALFV, used by memory array 501 during read and write operations and high voltage driver circuit 518, denoted WSHDRHALFV, used by memory array 502 during read and write (erase/program) operations; and bitline inhibit voltage circuit 519 and bitline inhibit voltage circuit 520 used to un-select bitlines that are not intended to be programmed during a write operation for memory array 501 and memory array 520, respectively. These functional blocks are understood by those of ordinary skill in the art, and the block layout shown in FIG. 5 is known in the prior art.

As can be seen from the foregoing, high voltages are required for the program and erase operations for flash memory cells. These high voltages typically are generated by charge pumps, such as charge pumps 514 and 515, that boost the voltages received from an external voltage supply to the required levels.

FIG. 6 depicts prior art charge pump 600. Charge pump 600 receives input voltage VIN and generates output voltage $V_{OUT}$. Charge pump 600 comprises N boost stages, labeled stage 601-1, . . . , stage 601-N, where each boost stage receives an input voltage and generates an output voltage that exceeds the input voltage by a certain amount. By adding each stage to charge pump 600, the output voltage, $V_{OUT}$, can be increased to achieve the desired voltage.

FIG. 7 depicts prior art boost stage 700i, which is an example of a boost stage that can be used for stages 601-1, . . . , 601-N in FIG. 6. Here, i is an integer between 1 and N. Boost stage 700i receives voltage input VINi and generates voltage output VOUTi. Boost stage 700i comprises capacitors 701 and 702, global precharge gate (transistor) 703, boost gate (transistor) 704, and pass gate (transistor) 705. The transistors 703, 704, and 705 are NMOS transistors. The capacitors 701 and 702 are comprised of NMOS transistors, where the source and drains are interconnected.

During a global precharge phase, precharge gate 703 is on and precharges VOUTi to a voltage VB−VT, where VT is the threshold voltage of an NMOS transistor, and VB is a supplied drain voltage for precharge gate 703. For each clock pumping cycle there are a (local) precharge period (when the clock is low) and a charge pumping period (when the clock transitions from low to high). During the precharge period, the top plate of capacitor 701 is at the voltage VINi when CLKP is low. CLKP and CLKB generally are non-overlapping, in-phase clock signals, wherein typically CLKP goes high, then CLKB goes high and CLKB goes low, and then CLKP goes low. During the charge pumping period, CLKP goes high, and the voltage of the top plate of capacitor 701 will be boosted to VINi+VDD (where VDD is the voltage difference between high state and low state voltages of CLKP).

One inherent challenge of adding boost stages 700i together in a serial fashion is that as the VINi increases with each subsequent boost stage, the voltage that must be applied to the gate of pass gate 705 to turn on pass gate 705 also will increase, as pass gate 705 will conduct only when the voltage applied to its gate exceeds the voltage on its source (which is VOUTi) by the threshold voltage, VT, of pass gate 705. The threshold voltage VT of pass gate 705 and boost gate 704 is progressively higher for subsequent stages due to the NMOS body effect, and therefore, it becomes harder to pump efficiently among the higher voltage stages.

During the precharge period, the node ING, which is the top plate of capacitor 702, will be at VINi from the action of transistor 704 (VOUTi on the gate of transistor 704 gate will cause ING=VINi). When CLKB then goes high, i.e. from ground to VDDboost, where VDDboost is the high voltage state of CLKB, e.g., VDDboost=~2*VDD, ING will increase to VINi+VDDboost (the high voltage of CLKB). At this point, pass gate 705 will conduct and transfer the charge at the VINi node (which is =the previous VINi+VDD at this time due to CLKP going high previously) to the output node VOUTi. At that point, VOUTi will be approximately the present VINi if the pass gate 705 is fully conducting, meaning the voltage at node ING (=previous VINi+VDDboost) is >=VOUTi+VT at this point. This becomes the VINi+1 for the next stage. If the voltage at node ING (=previous VINi+VDDboost) is <VOUTi+VT at this point, the charge transfer from the node VINi to the node VOUTi is incomplete, meaning VINi<VOUTi at this point. This for example happens at low VDD supply or at high VT value. Hence, improvement is needed especially for the situations where VDD is low and VT is high.

Furthermore, prior art charge pumps that use the design of FIGS. 6 and 7 have a deficiency in the last stage, stage 601-N, of the charge pump. Unlike all of the preceding stages, the Nth stage (the last stage) does not have a stage after it, and VOUT$_N$ therefore is not connected to capacitor 701 in a subsequent stage. As a result, the node ING can be stuck at a lower voltage due the gate (=VOUTN) of transistor 704 being stuck at a lower voltage since there is no capacitor 701 connected to the output to help boost up the voltage on the node VOUTi. The lower ING voltage causes pass gate 705 to shut off earlier, causing VOUTN to be at a lower output voltage than is desired.

This is shown graphically in FIG. 8. Here, chart 800 depicts VOUTPUT after each stage. In this example, N=15. It can be seen that at in the N-th stage (the last stage of the charge pump), the desired output would represent an increased voltage over the output of the previous stage. Instead, the output actually decreases below the output of the previous stage. This is an inherent problem of prior art charge pump 600 and prior art boost stage 700.

What is needed is an improved charge pump and boost stage design that eliminates the undesired shut-off of the pass gate transistor and the subsequent voltage dissipation in the last stage of the prior art design.

SUMMARY OF THE INVENTION

Disclosed herein are improved boost stage designs that eliminate the problem of the drooping voltage in the last boost stage that is endemic in prior art charge pumps. These designs include the addition of one or more of a clock doubling circuit, a local self-precharge circuit, a feed-forward precharge circuit, a feed-backward precharge circuit, a hybrid circuit comprising transistors and diodes, and a circuit comprising PMOS, DIODE and NMOS transistors.

DETAILED DESCRIPTION OF THE PREFERRED EMBODIMENTS

Figure 9:
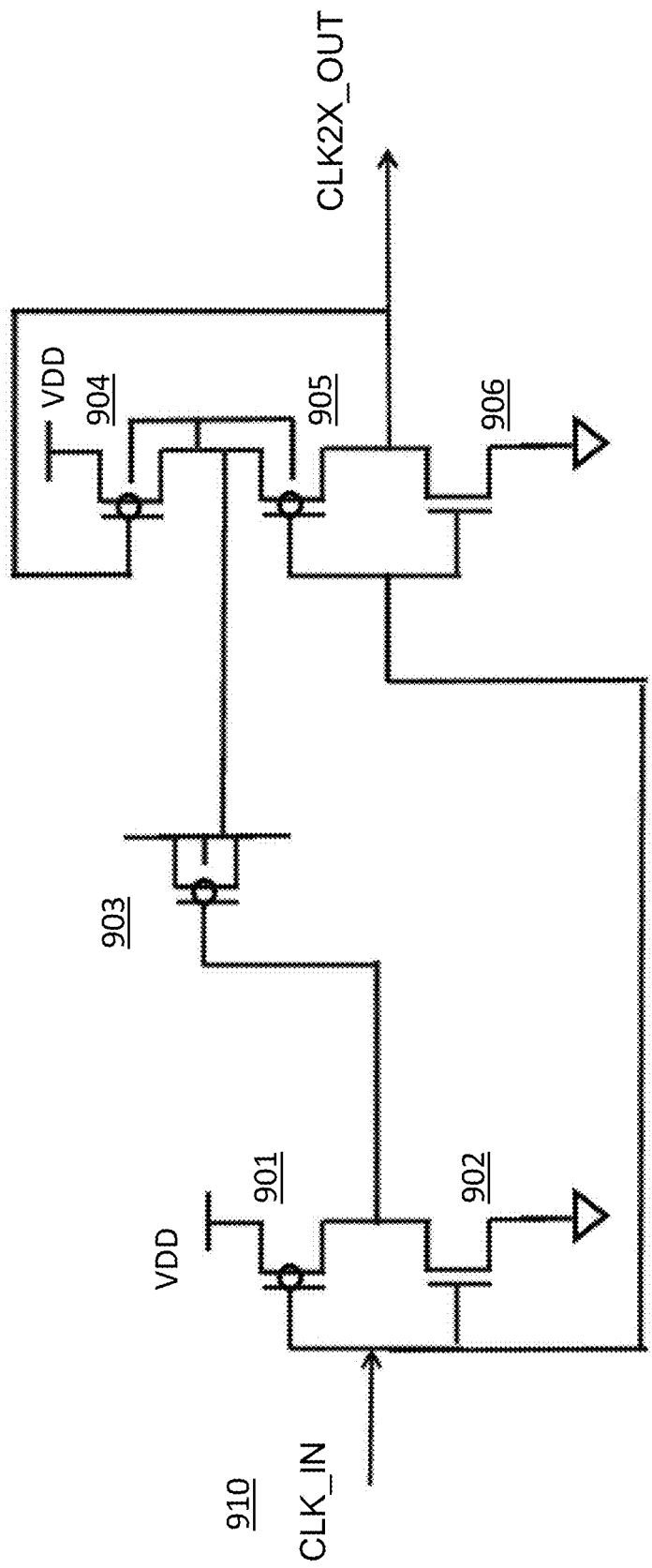
FIG. 9 depicts a clock doubling circuit.

In one embodiment, the amplitude of the clock signals that are provided to the capacitors are increased beyond the normal operating voltage of the clock signal, which will cause an increase in the boost voltage and an increase in the voltage applied to the pass gate. FIG. 9 depicts clock doubling circuit 900, which receives input CLK_IN (which typically will have a "1" value of VDD) and generates output CLK2X_OUT that has double the magnitude of CLK_IN (such as 2*VDD). Clock doubling circuit 900 comprises PMOS transistor 901 and NMOS transistor 902 that together form an inverter, doubler capacitor 903, PMOS transistors 904 and 905, and NMOS transistor 906. Doubler capacitor 903 comprises a PMOS transistor with a first terminal, second terminal, and substrate tied together. For PMOS transistor 904, a first terminal is coupled to VDD and a second terminal is coupled to the substrate and to the first terminal and substrate of PMOS transistor 905. For PMOS transistor 905, the first terminal and substrate are coupled to the second terminal of PMOS transistor 904, and a second terminal is coupled to the first terminal of NMOS transistor 906 and provides the output CLK2X_OUT. The input to the first terminal (gate) of doubler capacitor 903 is the inverted version of CLK_IN. Capacitor 903 achieves a maximum charge that is approximately two times the magnitude of CLK_IN. For example, if CLK_IN oscillates between 0V and VDD and if the voltage supply to each of PMOS transistor 901 and 904 is VDD, the voltage on second terminal (source/drain/bulk) of capacitor 903 will reach a peak of 2*VDD.

Additional detail regarding the operation of clock doubling circuit 900 will now be provided. When CLK_IN is high, NMOS transistors 902 and 906 will be turned on, and CLK2X_OUT will be pulled low, turning on PMOS transistor 904, thus setting the second plate of doubler capacitor 903 to VDD, while the first plate of doubler capacitor 903 is at ground potential. When CLK_IN is low, NMOS transistors 902 and 906 will be off, PMOS transistors 901 and 905 will be on, the first plate of doubler capacitor 903 is set to VDD, the second plate of doubler capacitor 903 thus is at 2*VDD and CLK2X_OUT will be equal to the voltage of capacitor 903. Thus, CLK2X_OUT has the same frequency and phase as CLK_IN but has twice the magnitude.

Figure 7:
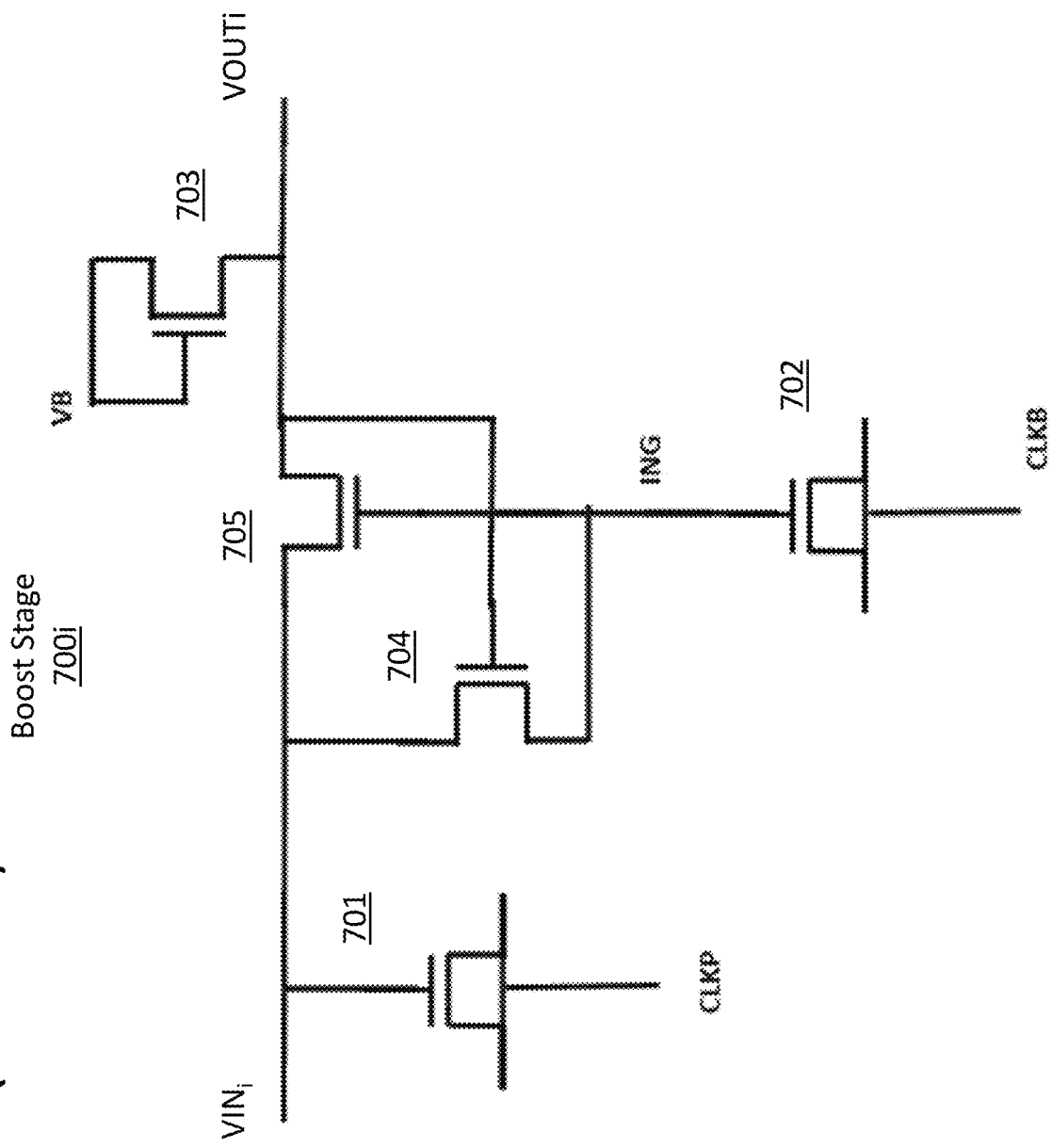
FIG. 7 depicts a boost stage in a prior art charge pump.
Figure 8:
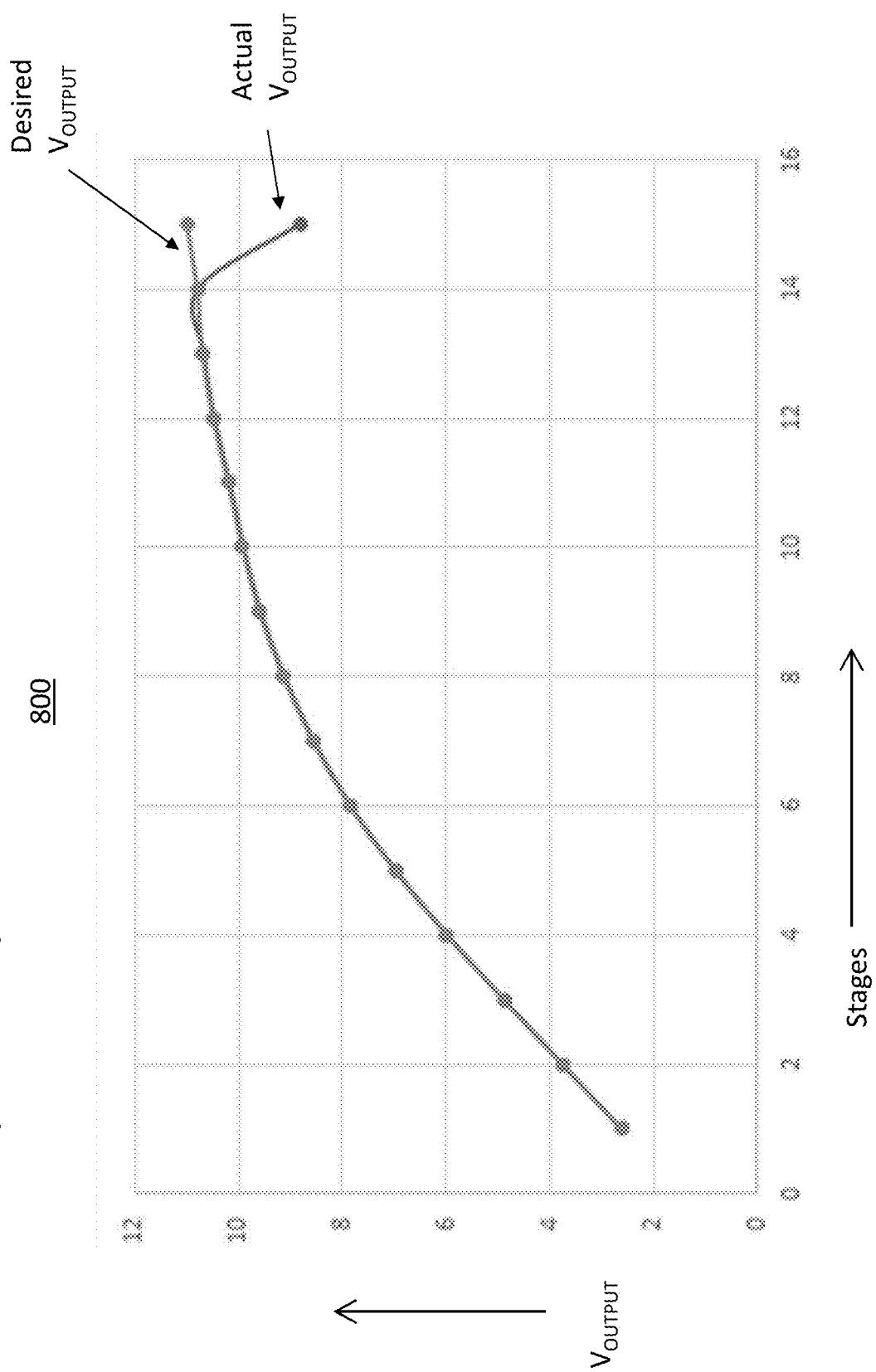
FIG. 8 depicts a chart showing an endemic problem in the last boost stage of the prior art charge pump of FIGS. 6 and 7.

Thus, with reference to FIG. 7, one could double the magnitude of CLKP and/or CLKB before applying them to capacitors 701 and 702, respectively. The voltage on the CLK2X_OUT will be transferred through the capacitors 701 and/or 702 into the internal pump nodes on the other side of each capacitor (node ING in the case of capacitor 702), where the transferred voltage will depend on the ratio of the doubler capacitor 903 and the value of the capacitor that receives CLK2X_OUT (capacitors 701 and/or 702). Applying CLK2X_OUT to capacitor 701 would cause a larger boost to VINi, and the latter would apply a larger voltage to the gate of pass gate 705 to keep it on.

In other embodiments, circuitry is added to keep pass gate 705 on for complete charge transfer thereby preventing the early shut off of pass gate 705 as in the prior art and/or to maintain the output voltage of a boost stage at a voltage level at least as high as the input voltage of the boost stage.

Figure 10:
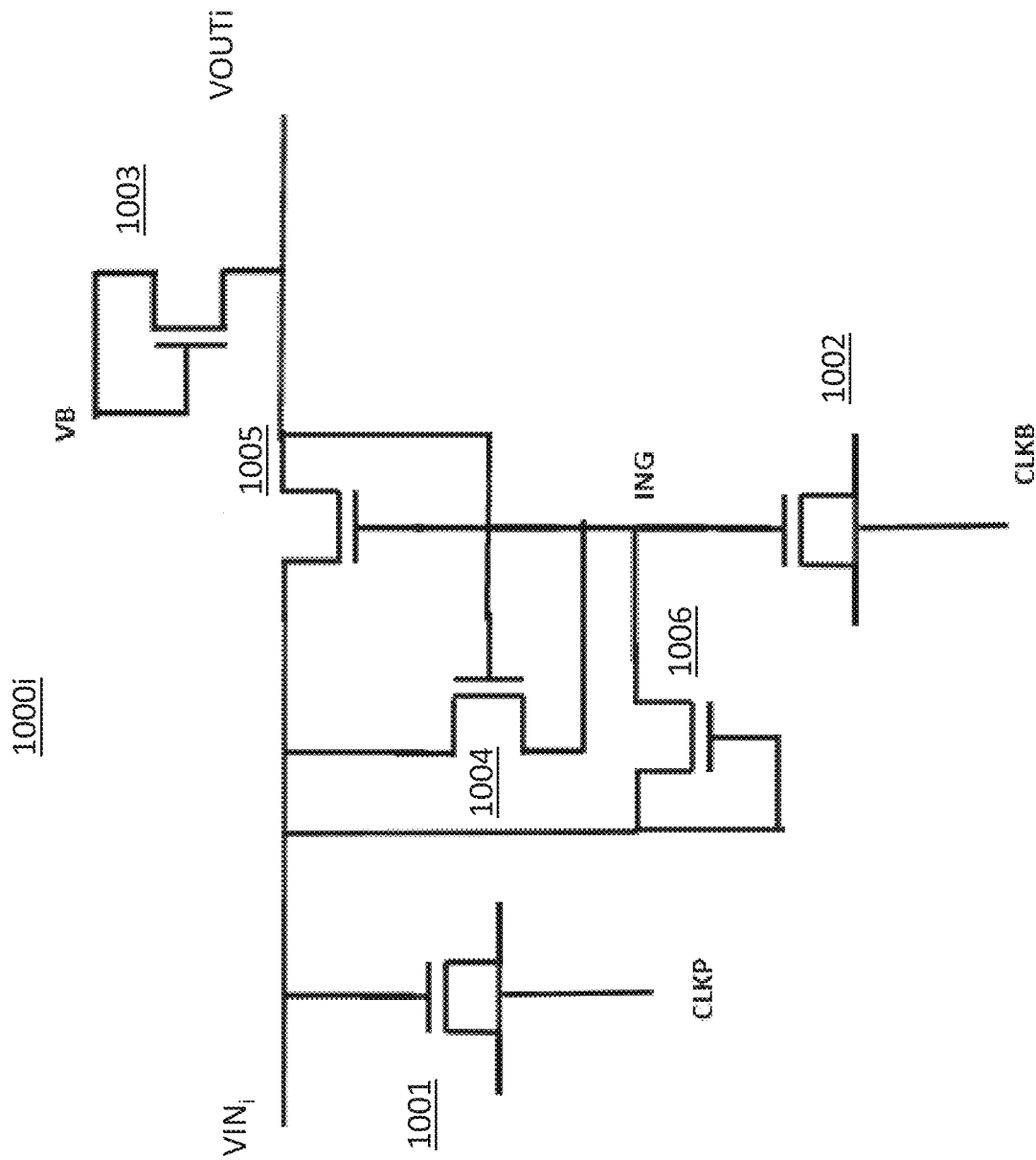
FIG. 10 depicts a boost stage comprising a local feed-forward precharge circuit

FIG. 10 depicts boost stage 1000i that comprises a local forward precharge circuit. Boost stage 1000i receives an input VINi and generates an output VOUTi and is the i-th boost stage in a charge pump. Boost stage 1000i comprises capacitors 1001 and 1002 that receive inputs CLKP and CLKB at a first terminal thereof, respectively. Boost stage 1000i further comprises precharge gate 1003, boost gate 1004, pass gate 1005, and local feedforward precharge transistor 1006. Local feedforward precharge transistor 1006 here is configured as a diode. Precharge gate 1003, boost gate 1004, pass gate 1005, and local feedforward precharge transistor 1006 are native NMOS transistors. Capacitors 1001 and 1002 are comprised of native NMOS transistors. The VT of native NMOS is approximately 0V.

In an alternative embodiment, transistor 1004 is removed.

In the initial global precharge phase, precharge gate 1003 is on and precharges VOUTi to the voltage VB–VT. Boost stage 1000i operates in the same manner as boost stage 700i of the prior art except for the operation of transistor 1006. Here, transistor 1006 is configured as a diode (gate and drain connected together) and guarantees that the node ING will always be at least as high as VINi–VT at the precharge period of the clock pumping cycle and as high as VINi+ VDD–VT+VDDboost at the charge pumping (transfer) period (+VDD is the high state value of CLKP, +VDDboost is the high state value of CLKB). This means that the gate of pass gate 1005 will always receive a voltage at least as high as VINi+VDD–VT+VDDboost during the charge pumping period and as a result VOUTi will never be lower than VINi. Thus, the output voltage of the N-th stage in an N-stage charge pump will never be lower than $VIN_N$. This limits the drooping effect and guarantees that the output voltage of the last stage will be at least as high as the output voltage of the second-to-last stage. Furthermore since the voltage ING gets an additional boost from VINi through transistor 1006 when CLKP goes high (=VINi+VDD–VT+ VDDboost), the charge transfer from the VINi to VOUTi is much more efficient, especially at low VDD and/or at high VT, which is a substantial improvement over the prior art.

Figure 11:
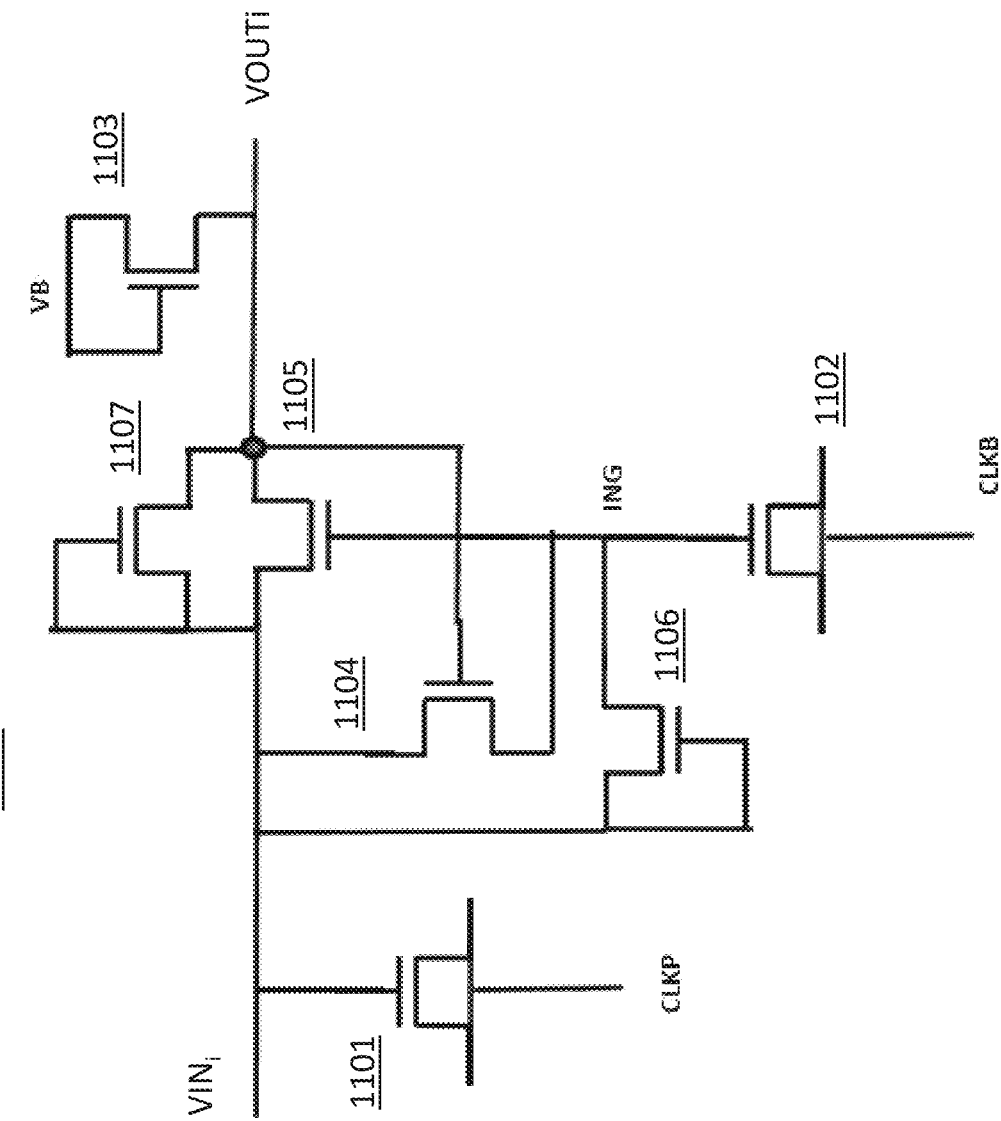
FIG. 11 depicts a boost stage comprising a feed-forward precharge circuit.

FIG. 11 depicts boost stage 1100i that comprises a local forward-feeding precharge and drive circuit. Boost stage 1100i receives an input VINi and generates an output VOUTi and is the i-th boost stage in a charge pump. Boost stage 1100i comprises capacitors 1101 and 1102 that receive inputs CLKP and CLKB, at respective first terminals thereof. Boost stage 1100i further comprises global precharge gate 1103, boost gate 1104, and transistors 1105, 1106, and 1107. Boost stage 1100i is similar to boost stage 1000i except for the addition of forward drive native NMOS transistor 1107. Transistor 1107 here is configured as a diode in parallel with pass gate 1105.

In the initial global precharge phase, precharge gate 1103 is on and precharges VOUTi to the voltage VB. Local feed forward precharge transistor 1106 is configured as a diode and guarantees that node ING will always be at least as high as VINi–VT during the precharge period of a clock pumping cycle and as high as VINi+VDD–VT+VDDboost during the charge transfer period. This means that the gate of pass gate 1105 will always receive a voltage at least as high as VINi+VDD–VT+VDDboost. In addition, transistor 1107 also guarantees that VOUTi will never be lower than VINi– VT, since transistor 1107 is acting as a diode. Thus, the output voltage of the N-th stage in an N-stage charge pump will never be lower than VINi, which is the output voltage of the N–1-th stage. This limits the drooping effect and guarantees that the output voltage of the last stage will be at least as high as the output voltage of the second-to-last stage. These improvements result in more efficient charge transfer from VINi to VOUTi. An alternative embodiment would be the same as boost 1100i but would remove transistor 1106.

In another alternative embodiment, transistor 1104 is removed.

Figure 12:
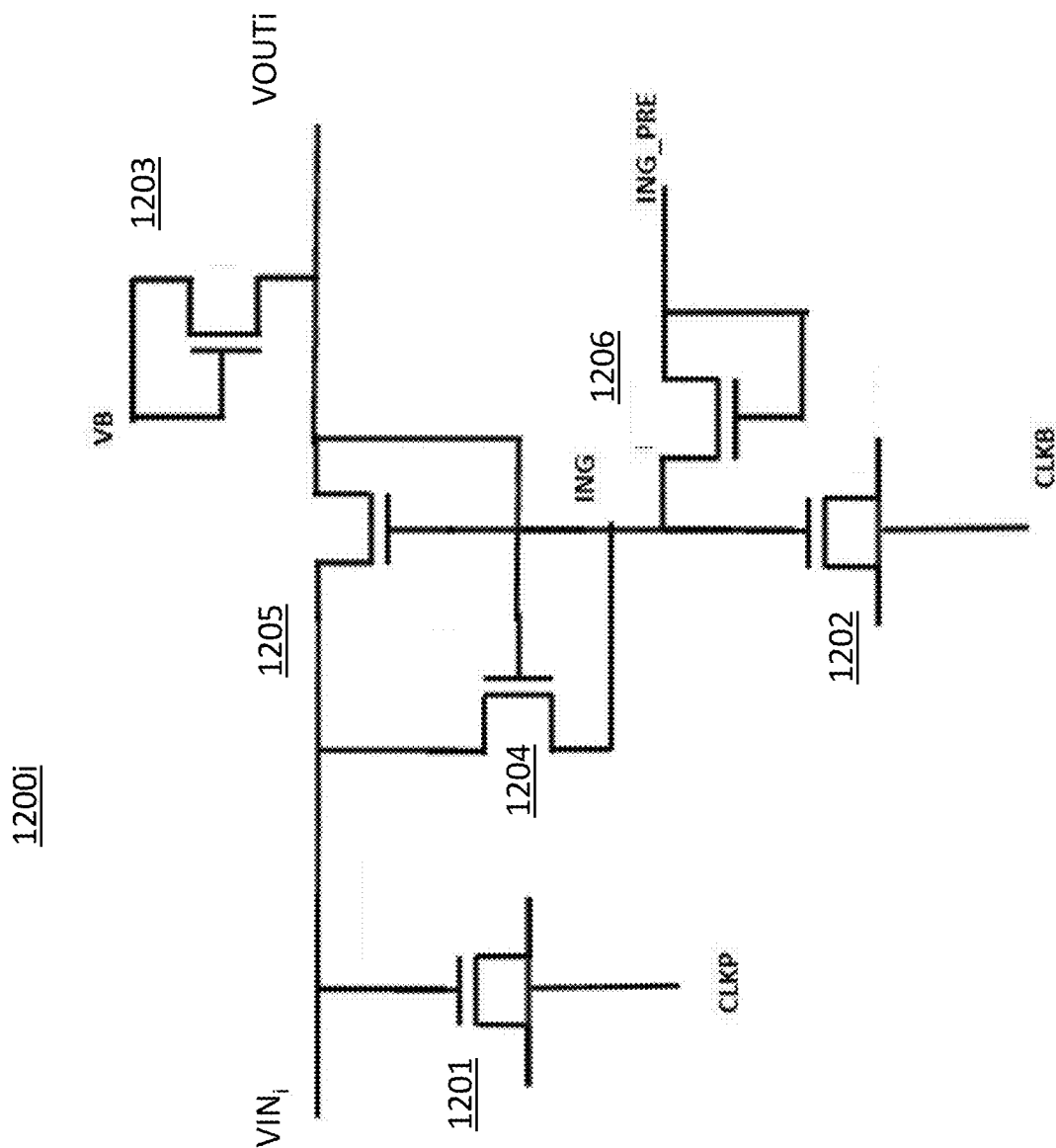
FIG. 12 depicts a boost stage comprising a feed-backward precharge circuit.

FIG. 12 depicts boost stage 1200i that comprises a feedbackward precharge circuit. Boost stage 1200i receives an input VINi and generates an output VOUTi and is the i-th boost stage in a charge pump. Boost stage 1200i comprises capacitors 1201 and 1202 that receive inputs CLKP and CLKB, respectively. Boost stage 1200i further comprises precharge gate 1203, boost gate 1004, and pass gate 1205. Boost stage 1200i further comprises local feedback precharge transistor 1206, which is configured as a diode that is precharged from the next adjacent stage in the charge pump or from a separate voltage source in the case of the last boost stage, labelled ING_PRE.

In the initial global precharge phase, precharge gate 1203 is on and precharges VOUTi to the voltage VB, and precharge gate 1206 is on and precharges node ING to ING_ PRE–VT. Boost stage 1200i operates in the same manner as boost stage 700i of the prior art except for precharge transistor 1206. This guarantees that the gate of pass gate 1205 will always receive a voltage at least as high as ING_PRE–VT. By selecting ING_PRE to be approximately the same as VINi or higher, VOUTi can be guaranteed to never be lower than VINi. Thus, the output voltage of the N-th stage in an N-stage charge pump will never be lower than VINN, which is the output of the N–1-th stage. This limits the drooping effect and guarantees that the output voltage of the last stage will be at least as high as the output voltage of the second-to-last stage. Furthermore the action of the transistor 1206 helps to boost the ING more effectively enhancing the charge pumping.

In an alternative embodiment, transistor 1204 is removed.

In an alternative embodiment, transistor 1206 is replaced with a diode (such as a Schottky diode or a p/n junction diode). The forward voltage (VD) of a Schottky diode is typically ~0.2 to 0.4V, and the forward voltage (VD) of a p/n junction diode is typically 0.4 to 0.6V.

In another alternative embodiment, transistor 1206 is replaced with a diode (such as a Schottky diode or a p/n junction diode), and transistor 1204 is removed.

Figure 13:
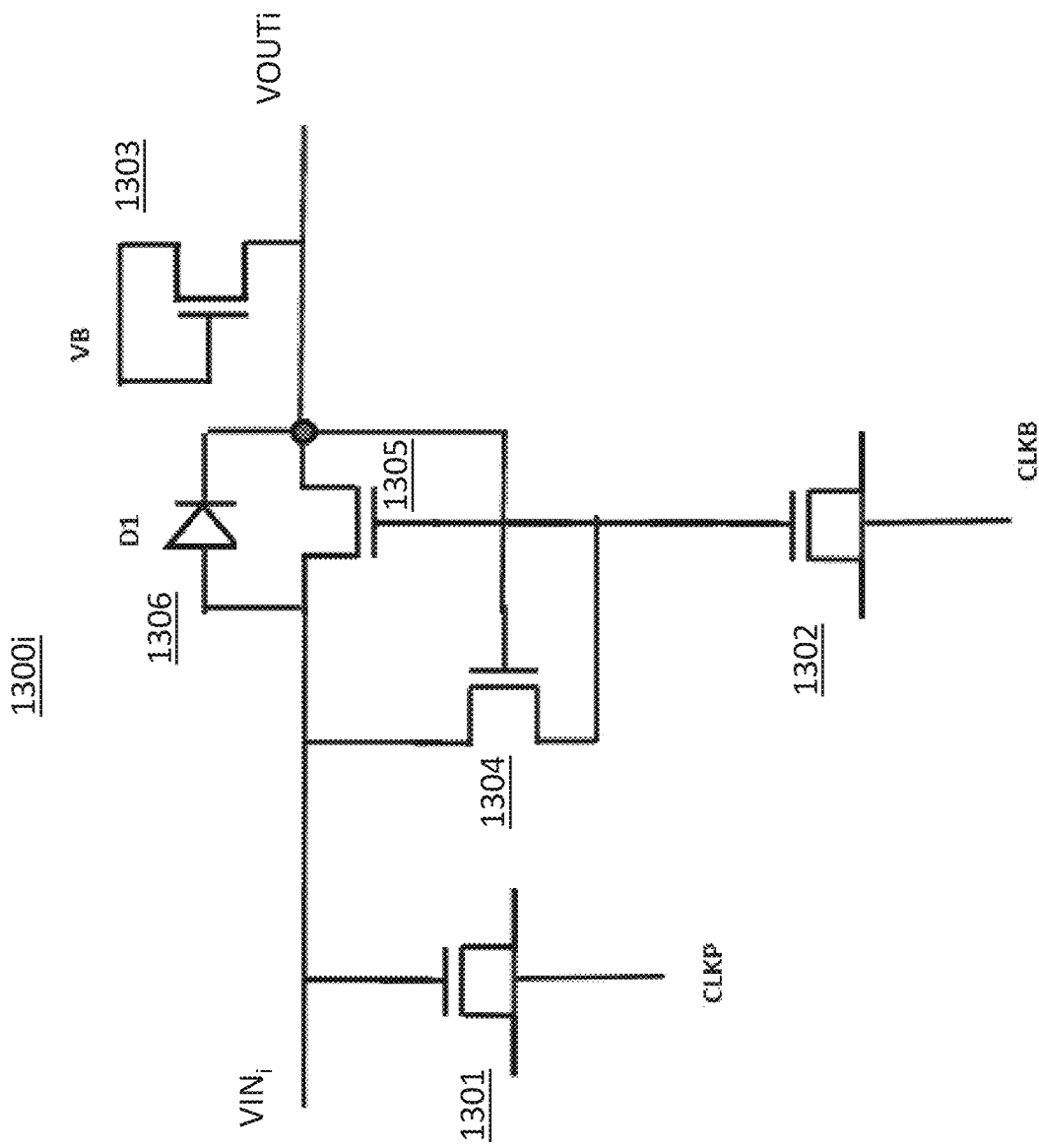
FIG. 13 depicts a first embodiment of a hybrid boost stage utilizing transistors and a diode.

FIG. 13 depicts boost stage 1300i that is a hybrid circuit containing transistors and a diode. Boost stage 1300i receives an input VINi and generates an output VOUTi and is the i-th boost stage in a charge pump. Boost stage 1300i comprises capacitors 1301 and 1302 that receive inputs CLKP and CLKB, respectively. Boost stage 1300i further comprises precharge gate 1303, boost gate 1304, pass gate 1305, and feedforward drive diode 1306. The feedforward drive diode 1306 optionally comprises a Schottky diode or p/n junction diode. Boost stage 1300i is the same as boost stage 1100i except that transistor 1107 has been replaced with diode 1306.

In the initial global precharge phase, precharge gate 1303 is on and precharges VOUTi to the voltage VB. Diode 1306 guarantees that VOUTi will never be lower than VINi–VT.

Thus, the output voltage of the N-th stage in an N-stage charge pump will never be lower than VINi–VT, which is the output of the N–1-th stage. This limits the drooping effect and guarantees that the output voltage of the last stage will be at least as high as the output voltage of the second-to-last stage. The forward drive diode 1306 enhances the charge pumping more effectively, especially in case where the threshold voltage of transistor 1305 is high.

Figure 14:
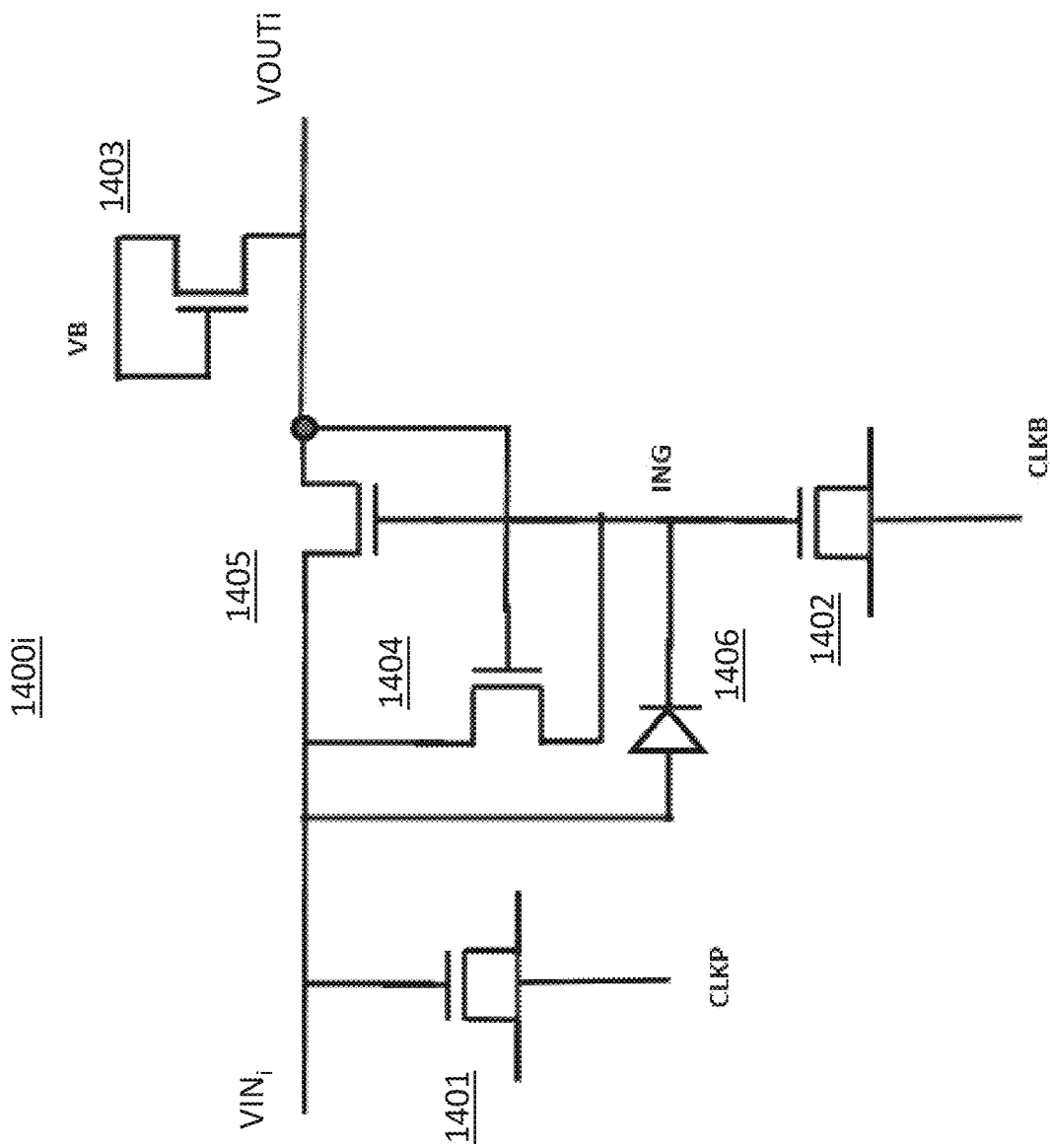
FIG. 14 depicts a second embodiment of a hybrid boost stage utilizing transistors and a diode.

FIG. 14 depicts boost stage 1400i that is a hybrid circuit containing transistors and a diode. Boost stage 1400i receives an input VINi and generates an output VOUTi and is the i-th boost stage in a charge pump. Boost stage 1400i comprises capacitors 1401 and 1402 that receive inputs CLKP and CLKB, respectively. Boost stage 1400i further comprises precharge gate 1403, boost gate 1404, pass gate 1405, and local precharge diode 1406. The local precharge diode 1406 optionally comprises a Schottky diode or a p/n junction diode. Boost stage 1400i is similar to boost stage 1100i except that transistor 1106 is replaced with diode 1406. The forward precharge diode 1406 enhances the charge pumping more effectively since it helps to precharge the node ING to a higher voltage.

In the initial global precharge phase, precharge gate 1403 is on and precharges VOUTi to the voltage VB. Here, local precharge diode 1406 guarantees that node ING will always be at least as high as VINi–VD (diode forward voltage). This means that the gate of pass gate 1405 will always receive a voltage at least as high as VINi–VD and that VOUTi will never be lower than VINi. Thus, the output voltage of the N-th stage in an N-stage charge pump will never be lower than VINN. This limits the drooping effect.

In an alternative embodiment, transistor 1404 is removed from boost stage 1400i.

Figure 15:
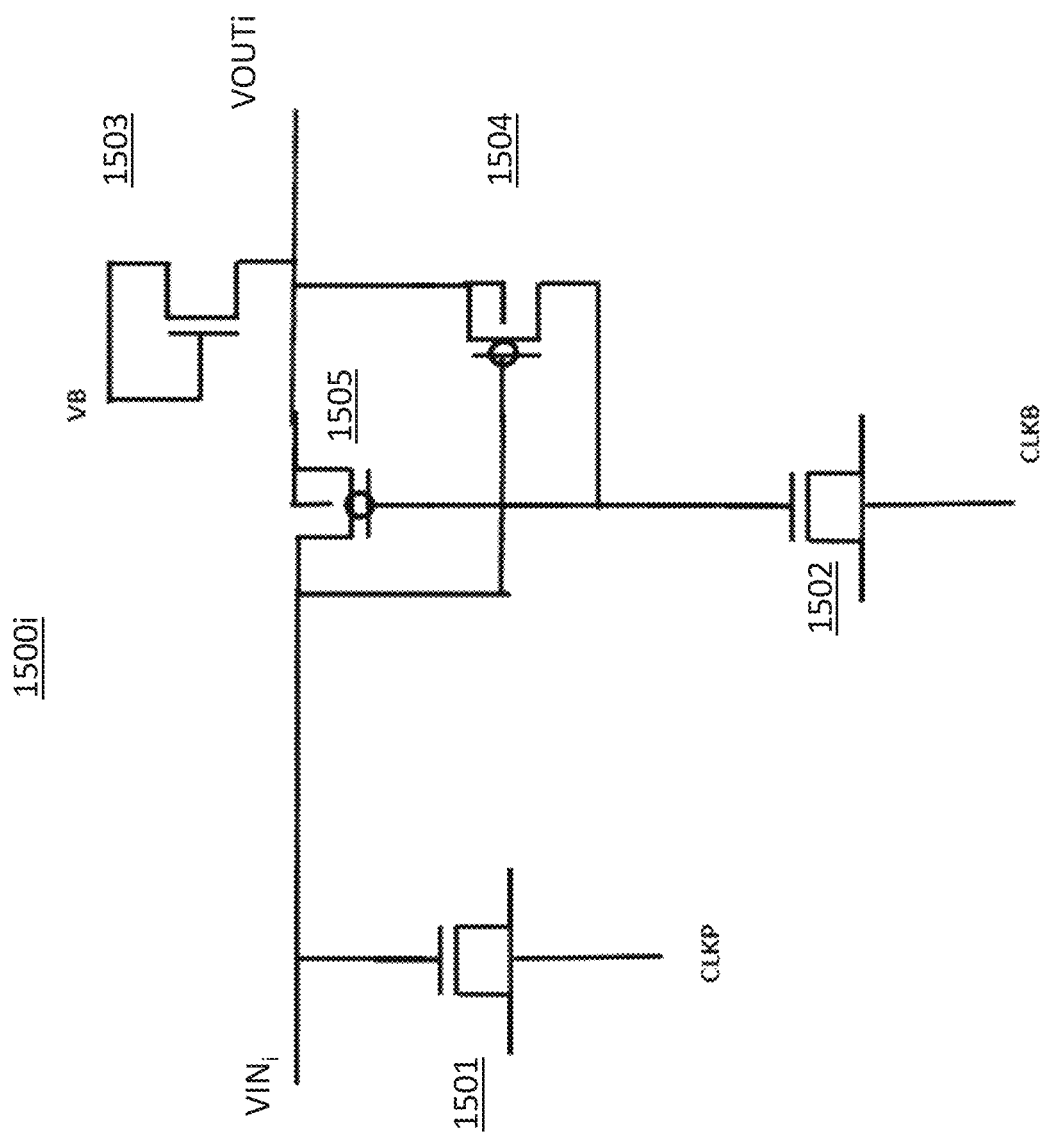
FIG. 15 depicts a first embodiment of a boost stage comprising PMOS and NMOS transistors.

FIG. 15 depicts boost stage 1500i, which utilizes PMOS and NMOS transistors. Boost stage 1500i receives an input VINi and generates an output VOUTi and is the i-th boost stage in a charge pump. Boost stage 1500i comprises capacitors 1501 and 1502 that receive inputs CLKP and CLKB, respectively. Boost stage 1500i further comprises precharge gate 1503, boost gate 1504, and pass gate 1505. The precharge gate 1503, capacitors 1501 and 1502 are constituted of NMOS transistors. The boost gate 1504 and pass gate 1505 are PMOS transistors with its source connected to its bulk.

In the initial global precharge phase, precharge gate 1503 is on and precharges VOUTi to the voltage VB. Boost stage 1500i operates in the same manner as boost stage 700i of the prior art except that the use of PMOS transistors for pass gate 1505 and boost gate 1504 helps ensure that VOUTi will not be lower than VINi. This is because the threshold voltage VT of a PMOS transistor is typically around 0.6V, and PMOS transistors do not have the body effect (voltage across source-bulk is 0V), and the VT for a PMOS is generally much less than VDD. Thus, in the last stage, VOUTN will not be lower than VINi, which is the output voltage of the previous stage, due to pass gate 1505. This limits the drooping effect and guarantees that the output voltage of the last stage will be at least as high as the output voltage of the second-to-last stage.

Figure 16:
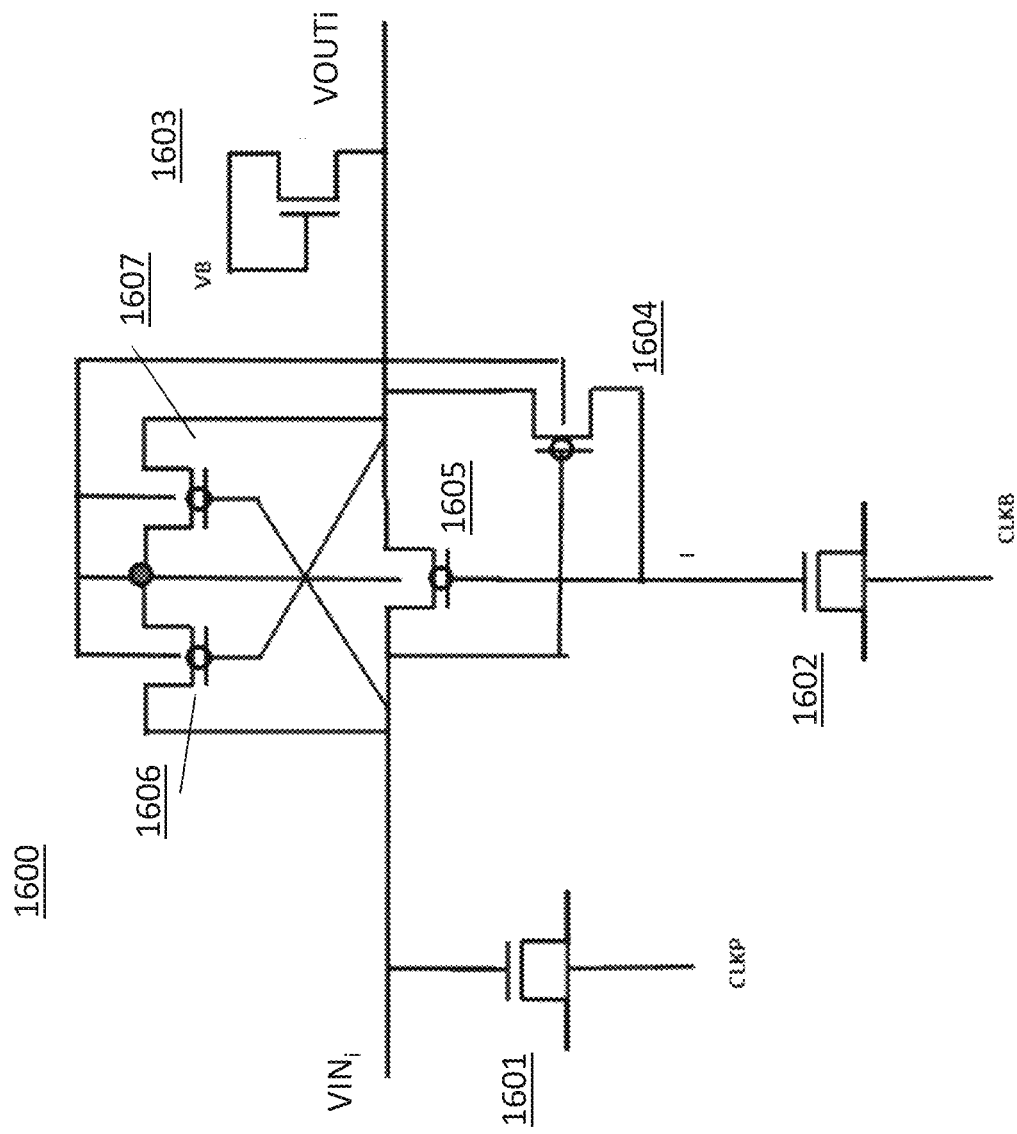
FIG. 16 depicts a second embodiment of a boost stage comprising PMOS and NMOS transistors.

In an alternative embodiment, boost stage 1500i or 1600i of FIG. 15 or FIG. 16 is used with the additional of a local feed-forward or feed-backward precharge device discussed previously with reference to FIGS. 10-14 (e.g., a Schottky diode, a p/n junction diode, or a diode-connected transistor).

FIG. 16 depicts boost stage 1600i, which utilizes PMOS and NMOS transistors. Boost stage 1600i receives an input VINi and generates an output VOUTi and is the i-th boost stage in a charge pump. Boost stage 1600i comprises capacitors 1601 and 1602 that receive inputs CLKP and CLKB, respectively. Boost stage 1600i further comprises precharge gate 1603, boost gate 1604, and pass gate 1605. Transistors 1603, capacitors 1601 and 1602 constitute native NMOS transistors. Transistors 1604 and 1605 are PMOS transistors with their bulk being switched to the highest voltage from VINi or VOUTi at any given time. Boost stage 1600i further comprises bulk switching PMOS transistors 1606 and 1607 configured as shown.

In the initial global precharge phase, precharge gate 1603 is on and precharges VOUTi to the voltage VB–VT. The use of PMOS transistors for pass gate 1605 and boost gate 1604 helps ensure that VOUTi will not be lower than VINi. The use of cross-coupled PMOS transistors 1606 and 1607 also guarantees that the bulk of PMOS transistors 1604 and 1605 will never be lower than VINi or VOUTi. Thus, in the last stage, $VOUT_N$ will never be lower than VINN, which is the output voltage of the previous stage. This limits the drooping effect and guarantees that the output voltage of the last stage will be at least as high as the output voltage of the second-to-last stage. The use of PMOS transistors with low VT without body effect enhances the efficiency of the charge pump.

Figure 17:
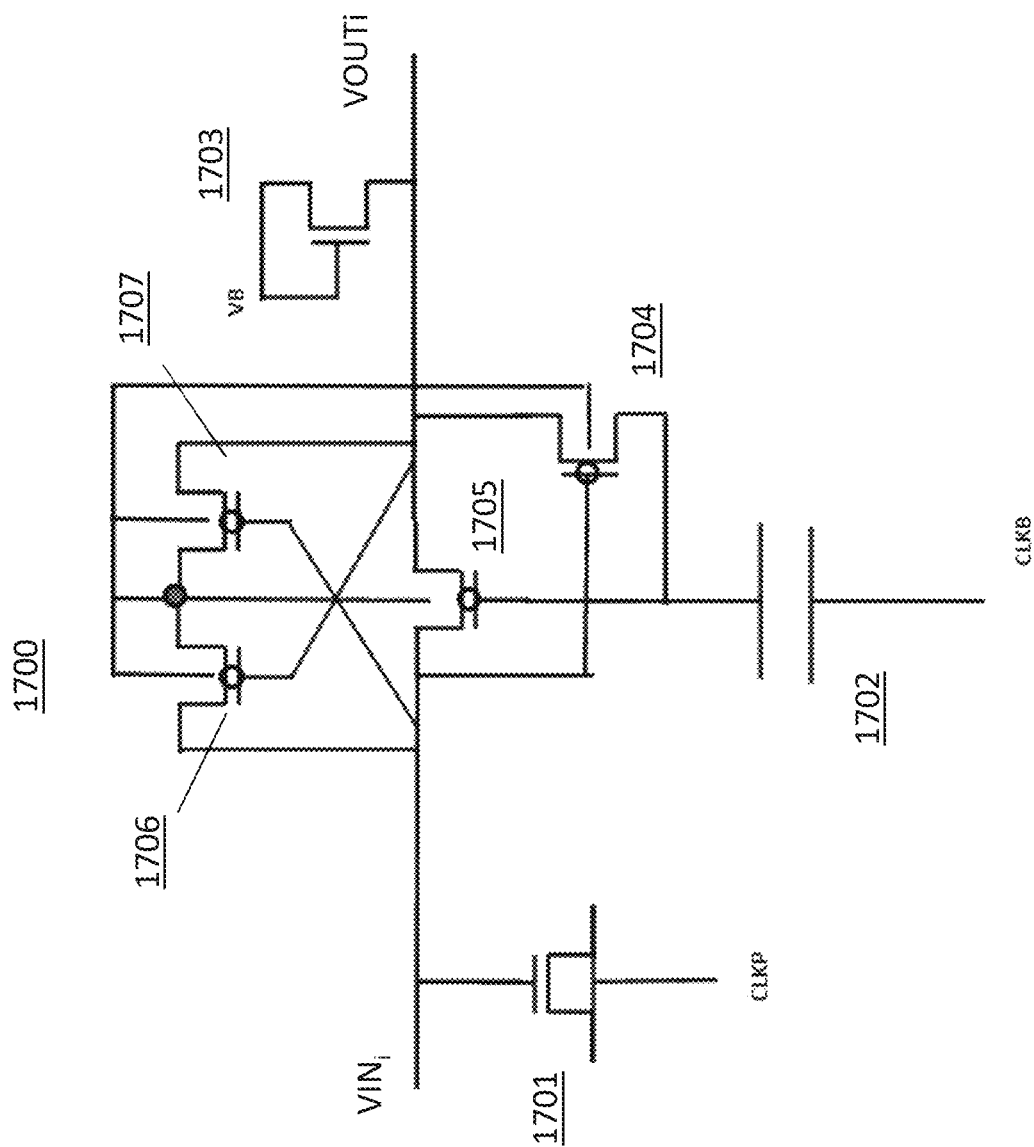
FIG. 17 depicts a third embodiment of a boost stage comprising PMOS and NMOS transistors.

FIG. 17 depicts boost stage 1700i, which utilizes PMOS and NMOS transistors. Boost stage 1700i receives an input VINi and generates an output VOUTi and is the i-th boost stage in a charge pump. Boost stage 1700i comprises capacitors 1701 and 1702 that receive inputs CLKP and CLKB, respectively. Boost stage 1700i further comprises precharge gate 1703, boost gate 1704, and pass gate 1705. Boost stage 1700i further comprises PMOS transistors 1706 and 1707 configured as shown. Boost stage 1700i is identical to boost stage 1600i except that capacitor 1602 (created from a transistor) has been replaced with MOM (metal-oxide-metal) or MIM (metal-insulator-metal) capacitor 1702. The use of MOM or MIM capacitor instead of a transistor is advantageous in avoiding the difficulties inherent in the turn-on voltage VT of the MOS transistor when it is being used as a capacitor. If the voltage across the MOS capacitor is <VT, then the capacitance is very minimal. This is advantageous in the first few stages, e.g., stages 1, 2, and 3 of a charge pump especially at a low VDD voltage. The tradeoff is that a MOM or MIM capacitor requires a larger area than a transistor.

Clock doubling circuit 900 and boost stages 1000i, 1100i, 1200i, 1300i, 1400i, 1500i, 1600i, and 1700i can be used in various combinations to create a charge pump comprising a plurality of boost stages.

Figure 1:
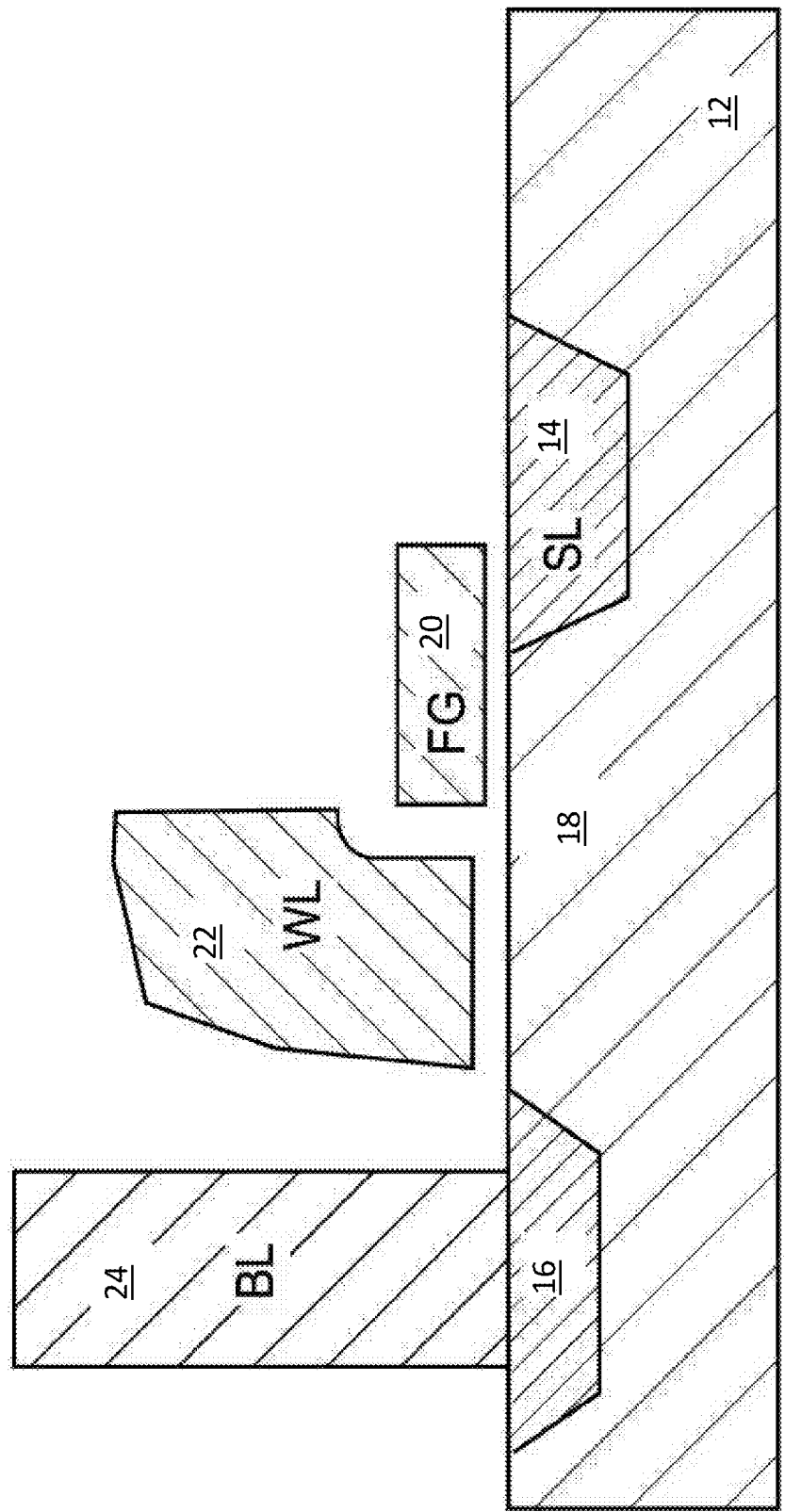
FIG. 1 depicts a prior art split gate flash memory cell.
Figure 2:
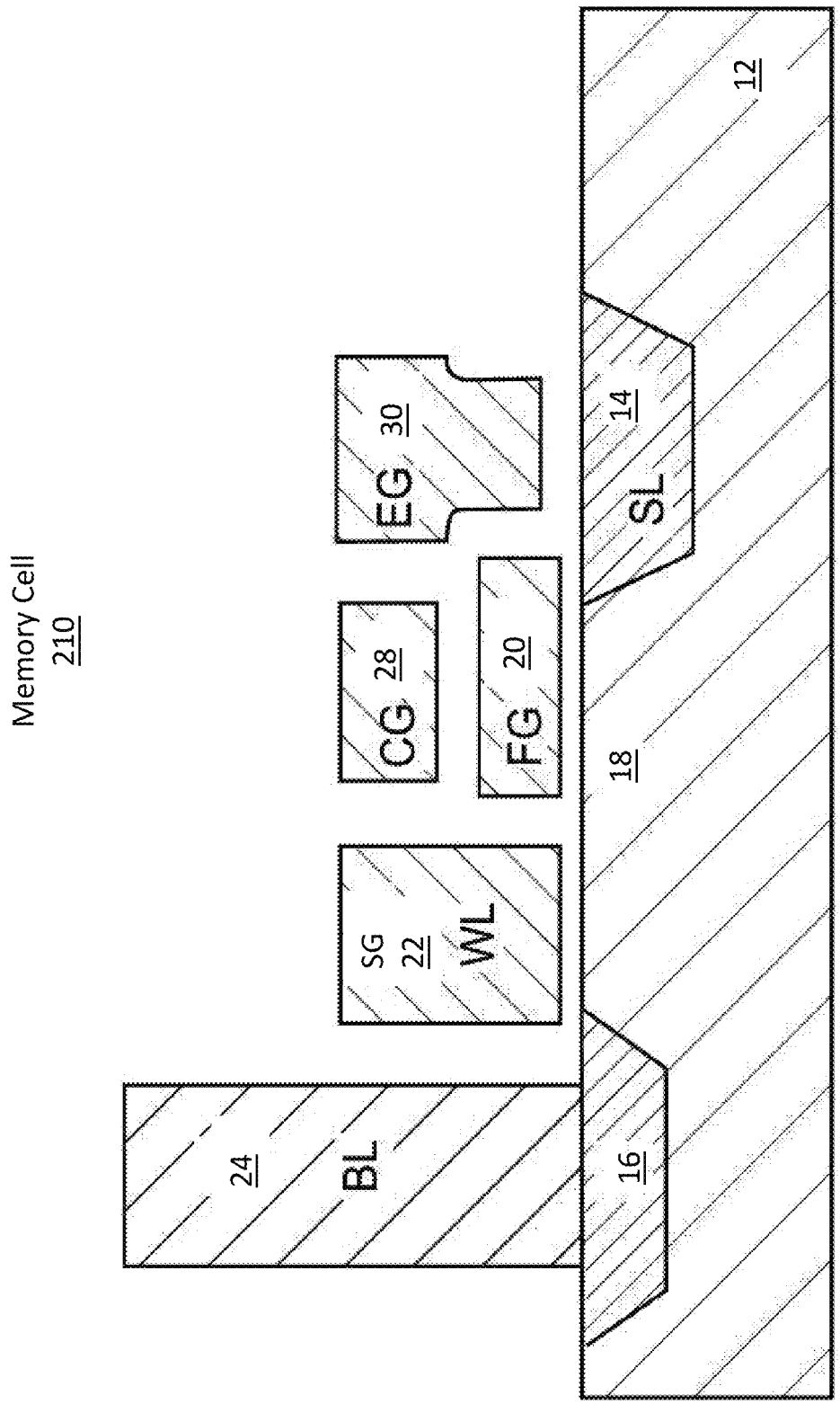
FIG. 2 depicts another prior art split gate flash memory cell.
Figure 3:
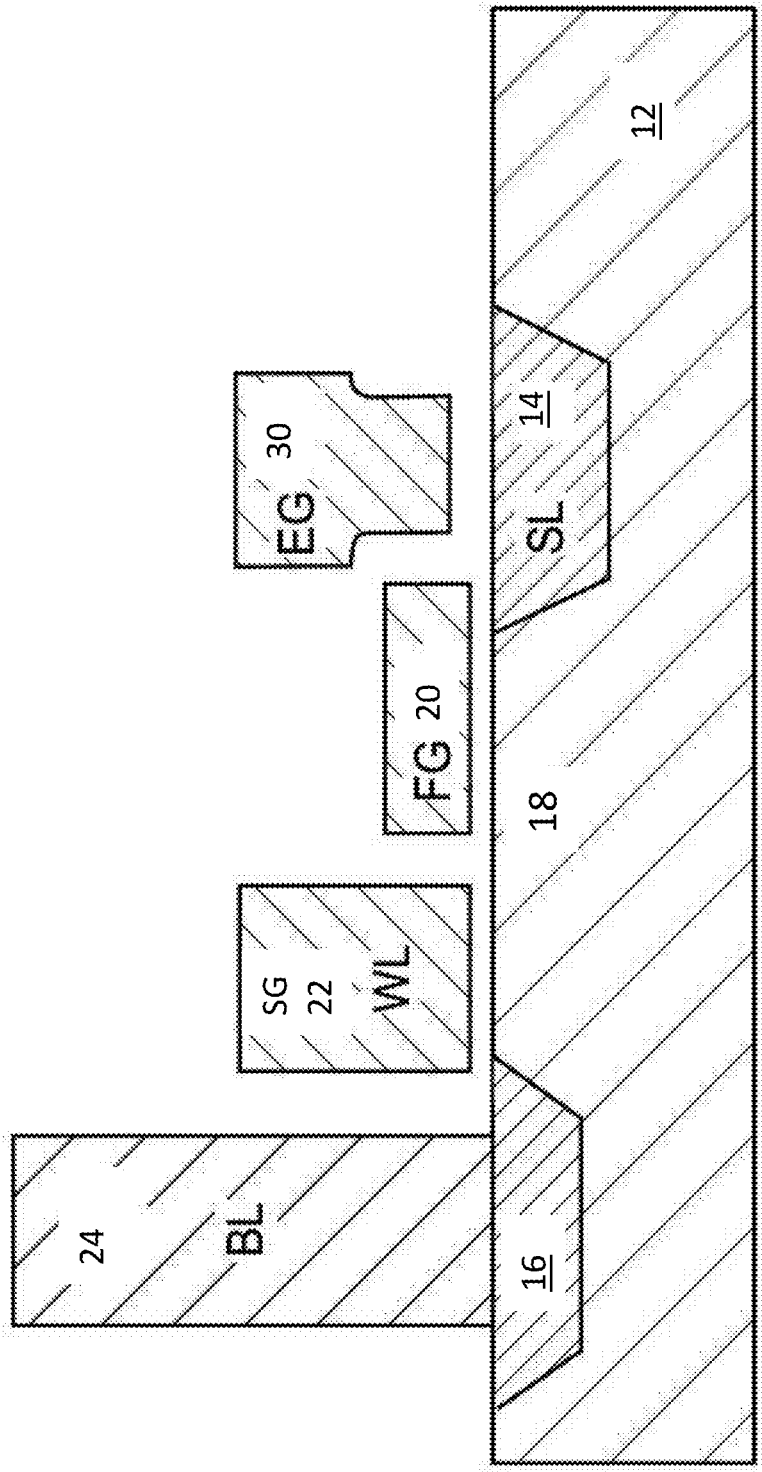
FIG. 3 depicts another prior art split gate flash memory cell.
Figure 4:
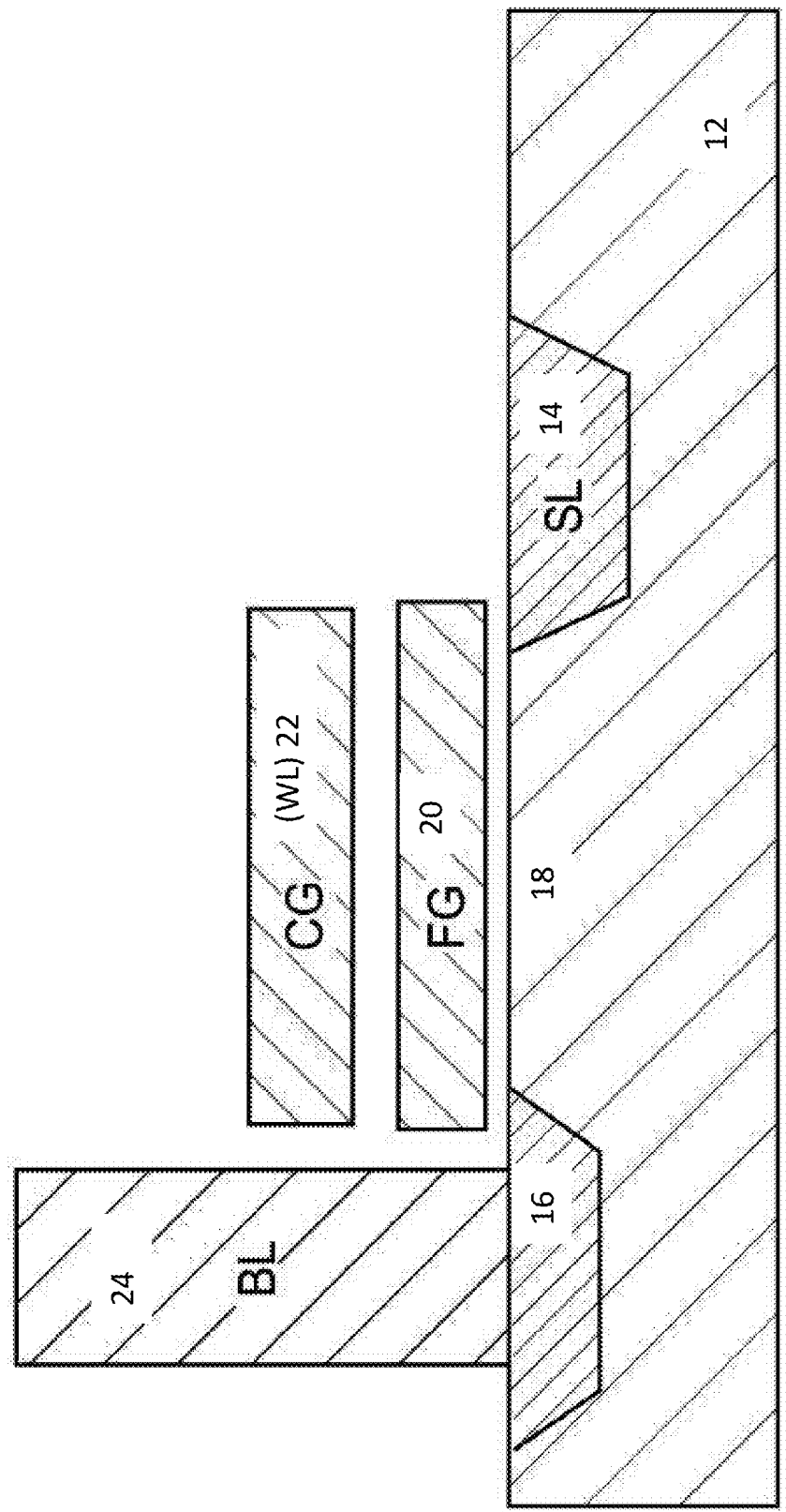
FIG. 4 depicts another prior art split gate flash memory cell.
Figure 5:
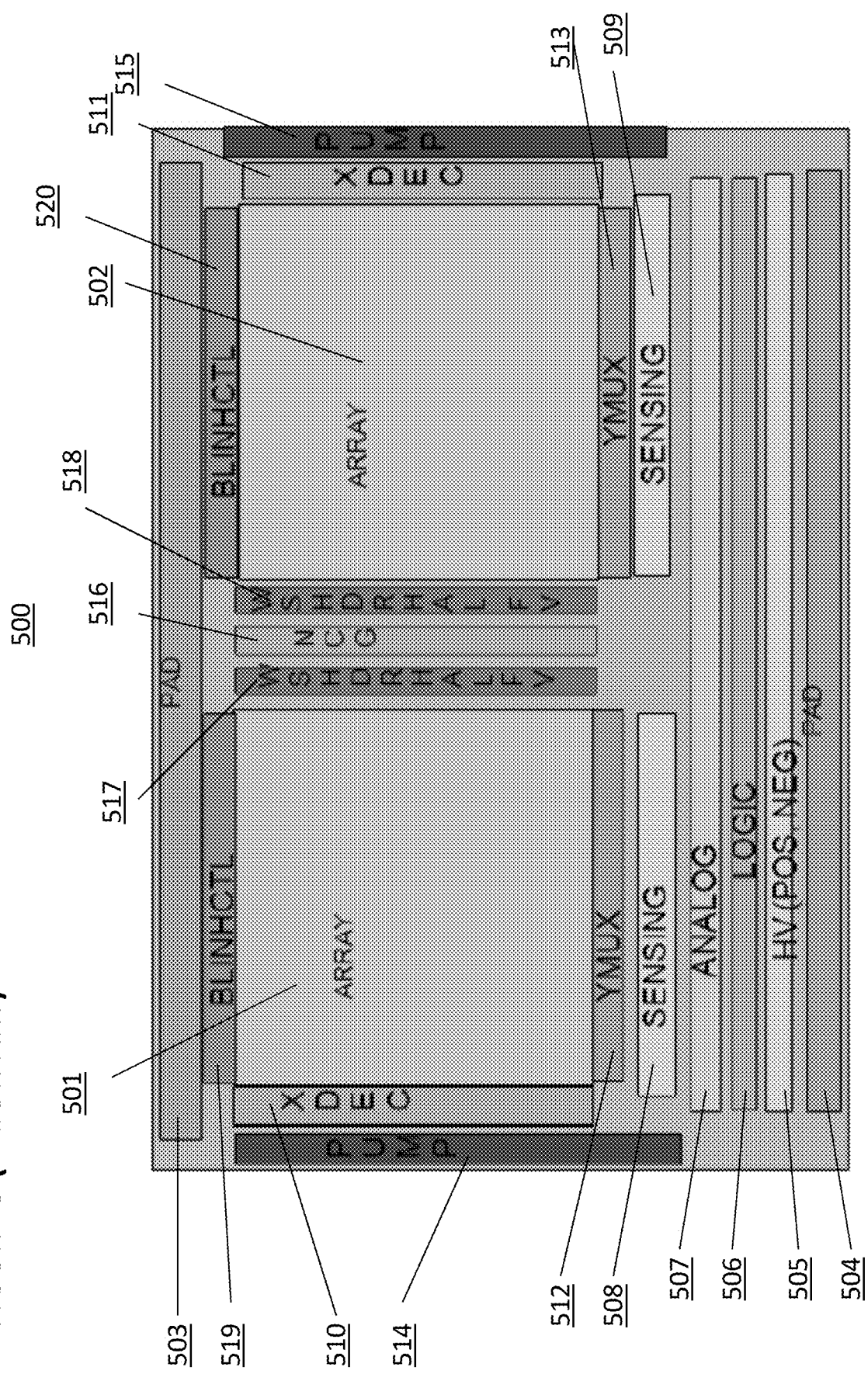
FIG. 5 depicts a layout for a prior art flash memory device.
Figure 6:
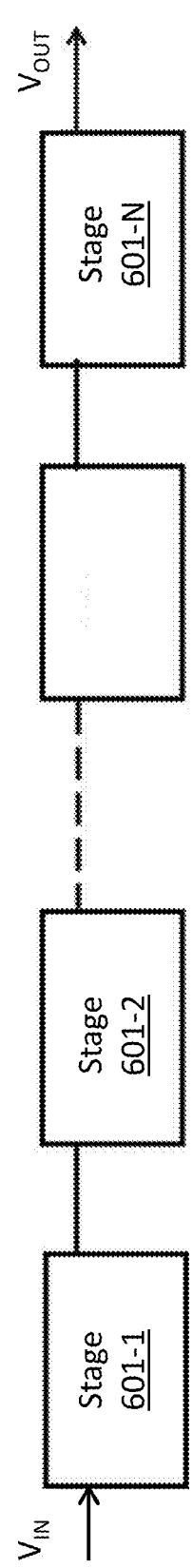
FIG. 6 depicts a prior art charge pump comprising N boost stages.

For instance, a plurality of boost stages can be coupled together in sequential fashion as shown in FIG. 6, where each of the plurality of boost stages in the plurality of boost stages is based on the same boost stage design, such as any of the designs of boost stages 1000i, 1100i, 1200i, 1300i, 1400i, 1500i, 1600i, and 1700i. In such a configuration, $VIN_1$ of the first stage is coupled to VIN (an input voltage source received by the charge pump), $VOUT_N$ of the N-th stage provides VOUT (the output voltage of the charge pump), and VOUTi of each of the other boost stages is coupled to VINi+1 of the next subsequent boost stage.

Figure 18:
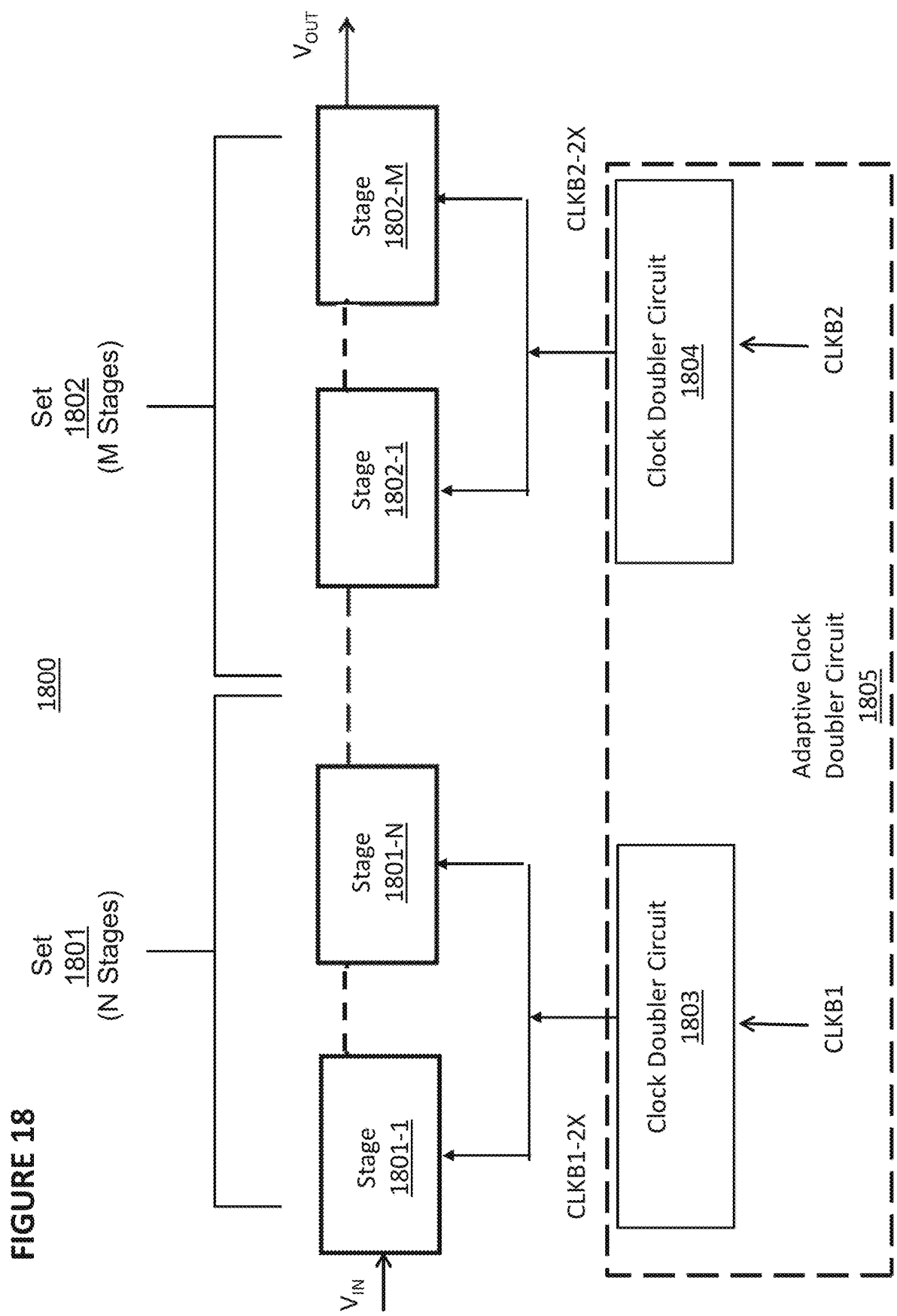
FIG. 18 depicts an embodiment of a charge pump comprising N boost stages coupled to a first clock doubling circuit and M boost stages coupled to a second clock doubling circuit.

FIG. 18 depicts another embodiment of a charge pump. Charge pump 1800 comprises set 1801 (a first set) of N boost stages, labeled stages 1801-1 through 1801-N. Charge pump 1800 further comprises set 1802 (a second set) of M boost stages, labeled stages 1802-1 through 1802-M. Adaptive clock doubler circuit 1805 comprises clock doubler circuit 1803 and clock doubler circuit 1804. Stages 1801-1 through 1801-N are driven by clock doubler circuit 1803, and stages 1802-1 through 1802-M are driven by clock doubler circuit 1804. Clock doubler circuit 1803 and clock doubler circuit 1804 each can comprise clock doubler circuit 900 discussed above with reference to FIG. 9.

Each subsequent stage within charge pump 1800 progressively receives a higher input voltage VINi, hence the VT of the pass and boost gates will be progressively higher due to a progressively higher body effect. Adaptive clock doubler circuit 1805 is designed to compensate for this phenomenon. Because the first few stages of the charge pump will experience a lower VT, the clock doubler circuit 1803 might use a doubler capacitor (e.g., doubler capacitor 903 in FIG. 9) of a lower capacitance value. The next stages experience a higher VT, hence clock doubler circuit 1804 might use a doubler capacitor (e.g., doubler capacitor 903 in FIG. 9) of a higher capacitance value to boost the ING nodes more effectively.

Clock doubler circuit 1803 receives CLKB1 as an input and generates CLKB1-2× as an output, where CLKB1-2× has a magnitude that is approximately twice the magnitude of CLKB1. Similarly, clock doubler circuit 1804 receives CLKB2 as an input and generates CLKB2-2X as an output, where CLKB2-2X has a magnitude that is approximately twice the magnitude of CLKB2. The doubler capacitor (e.g., doubler capacitor 903 in FIG. 9) of clock doubler circuit 1803 has a lower capacitance than the doubler capacitor (e.g., doubler capacitor 903 in FIG. 9) of clock doubler circuit 1804. CLKB1-2× is then used as the "CLKB" signal by boost stages 1801-1 through 1801-N, and CLKB2-2X is then used as the "CLKB" signal by boost stages 1802-1 through 1802-M (where the "CLKB" signal is the signal depicted in FIGS. 7 and 10-17). Thus, within charge pump 1800, N of the boost stages operate in response to CLKB1, and M of the boost stages operate in response to CLKB2. CLKB1 and CLKB2 optionally can be different in terms of frequency, phase, or amplitude.

Figure 19:
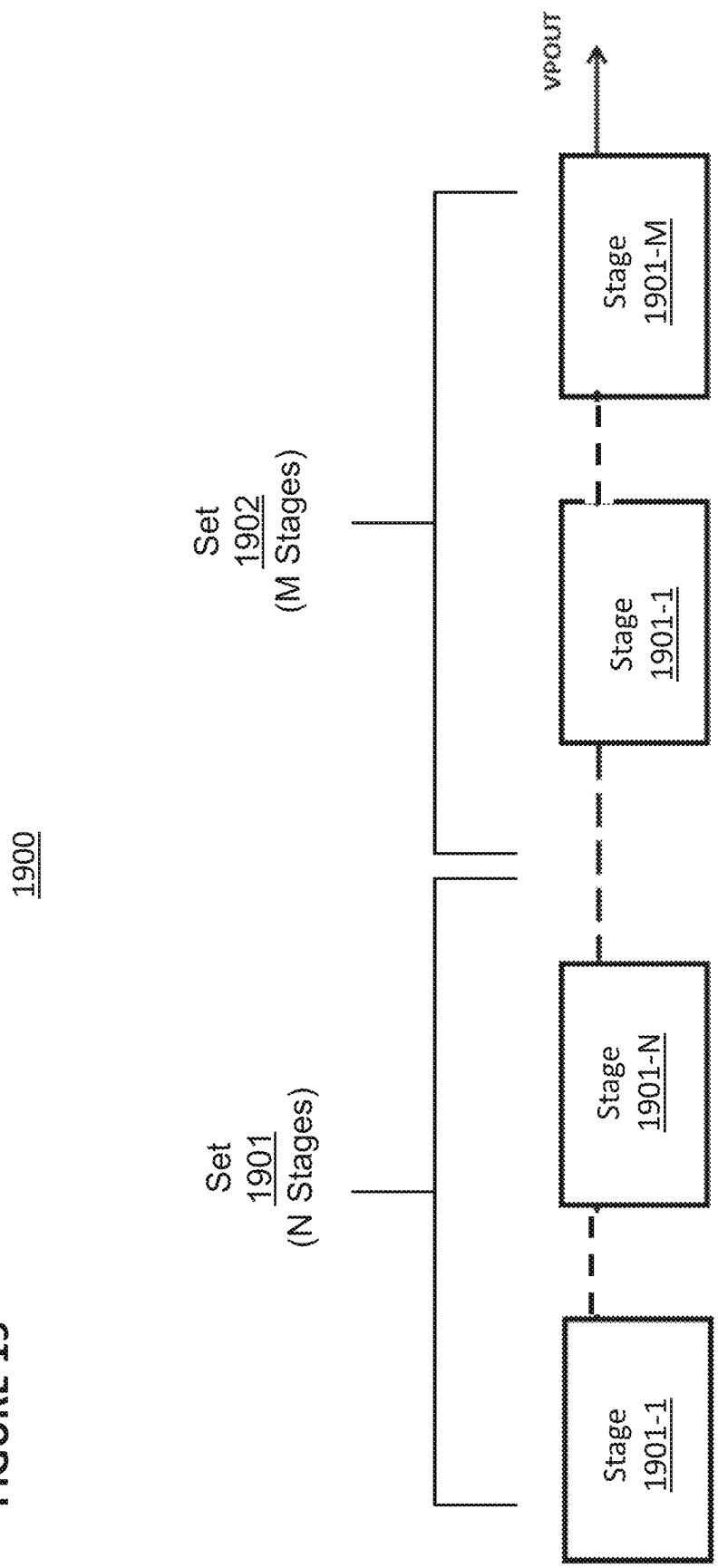
FIG. 19 depicts an embodiment of a charge pump comprising N boost stages of a first type and M boost stages of a second type.

FIG. 19 depicts another embodiment of a charge pump. Charge pump 1900 comprises set 1901 (a first set) of N boost stages, labeled stages 1901-1 through 1901-N. Charge pump 1900 further comprises set 1902 (a second set) of M boost stages, labeled stages 1902-1 through 1902-M. Stages 1901-1 through 1901-N can each be a boost stage containing boost stage of a first type, and stages 1902-1 through 1902-M can each be a boost stage of a second type, where the various types include the boost stage types shown in FIGS. 7 and 10-17 and other types known by those of ordinary skill in the art. Examples of pairings of a first type and a second type might be: a boost stage of only NMOS transistors (such as boost stages 1000i, 1100i, 1200i) and a boost stage of both NMOS and PMOS transistors (such as boost stages 1500i, 1600i, and 1700i); or a boost stage of only NMOS transistors (such as boost stages 1000i, 1100i, and 1200i) and a boost stage of NMOS transistors and diodes (such as boost stages 1300i and 1400i).

References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. A charge pump for receiving an input voltage and generating an output voltage, the charge pump comprising a plurality of boost stages and each of the plurality of boost stages comprising:
   an input node for the boost stage;
   an output node for the boost stage;
   a first capacitor comprising an input terminal for receiving a first clock signal and an output terminal coupled to the input node;
   a second capacitor comprising an input terminal for receiving a second clock signal and an output terminal;
   a pass gate comprising a first terminal coupled to the input node, a second terminal coupled to the output node, and a gate coupled to the output terminal of the second capacitor;
   a boost gate comprising a first terminal coupled to the input node, a second terminal coupled to the output terminal of the second capacitor, and a gate coupled to the output node;
   a transistor comprising a first terminal coupled to the input node, a gate coupled to the input node, and a second terminal coupled to the output terminal of the second capacitor;
   wherein the input node for the boost stage is coupled to an output node of another boost stage in the plurality of boost stages or to a source providing the input voltage; and
   wherein the output node for the boost stage is coupled to an input node of another boost stage in the plurality of boost stages or provides the output voltage.

2. The charge pump of claim 1, wherein each of the plurality of boost stages further comprises:
   a precharge gate comprising a first terminal coupled to a precharge voltage source, a gate coupled to the first terminal, and a second terminal coupled to the output node.

3. The charge pump of claim 1, wherein each of the plurality of boost stages further comprises:
   a transistor comprising a first terminal coupled to the input node, a gate coupled to the input node, and a second terminal coupled to the output node.

4. The charge pump of claim 3, wherein each of the plurality of boost stages further comprises:
   a precharge gate comprising a first terminal coupled to a precharge voltage source, a gate coupled to the first terminal, and a second terminal coupled to the output node.

5. A charge pump for receiving an input voltage and generating an output voltage, the charge pump comprising a plurality of boost stages and each of the plurality of boost stages comprising:
   an input node for the boost stage;
   an output node for the boost stage;
   a first capacitor comprising an input terminal for receiving a first clock signal and an output terminal coupled to the input node;
   a second capacitor comprising an input terminal for receiving a second clock signal and an output terminal;

a pass gate comprising a first terminal coupled to the input node, a second terminal coupled to the output node, and a gate coupled to the output terminal of the second capacitor;

a boost gate comprising a first terminal coupled to the input node, a second terminal coupled to the output terminal of the second capacitor, and a gate coupled to the output node;

a diode comprising a first terminal coupled to the input node and a second terminal coupled to the output node.

wherein the input node for the boost stage is coupled to an output node of another boost stage in the plurality of boost stages or to a source providing the input voltage; and wherein the output node for the boost stage is coupled to an input node of another boost stage in the plurality of boost stages or provides the output voltage.

6. The charge pump of claim 5, wherein each of the plurality of boost stages further comprises:

a precharge gate comprising a first terminal coupled to a precharge voltage source, a gate coupled to the first terminal, and a second terminal coupled to the output node.

7. A charge pump for receiving an input voltage and generating an output voltage, the charge pump comprising a plurality of boost stages and each of the plurality of boost stages comprising:

an input node for the boost stage;
an output node for the boost stage;
a first capacitor comprising an input terminal for receiving a first clock signal and an output terminal coupled to the input node;
a second capacitor comprising an input terminal for receiving a second clock signal and an output terminal;
a pass gate comprising a first terminal coupled to the input node, a second terminal coupled to the output node, and a gate coupled to the output terminal of the second capacitor;
a boost gate comprising a first terminal coupled to the input node, a second terminal coupled to the output terminal of the second capacitor, and a gate coupled to the output node;
a local precharge device comprising a first terminal coupled to another boost stage in the plurality of boost stages or to a voltage source and a second terminal coupled to the output terminal of the second capacitor;
wherein the input node for the boost stage is coupled to an output node of another boost stage in the plurality of boost stages or to a source providing the input voltage; and
wherein the output node for the boost stage is coupled to an input node of another boost stage in the plurality of boost stages or provides the output voltage.

8. The charge pump of claim 7, wherein the local precharge device is a Schottky diode or a p/n junction diode.

9. The charge pump of claim 7, wherein the local precharge device is a diode-connected transistor.

10. The charge pump of claim 7, wherein each of the plurality of boost stages further comprises:

a precharge gate comprising a first terminal coupled to a precharge voltage source, a gate coupled to the first terminal, and a second terminal coupled to the output node.

11. A charge pump for receiving an input voltage and generating an output voltage, the charge pump comprising a plurality of boost stages and each of the plurality of boost stages comprising:

an input node for the boost stage;
an output node for the boost stage;
a first capacitor comprising an input terminal for receiving a first clock signal and an output terminal coupled to the input node;
a second capacitor comprising an input terminal for receiving a second clock signal and an output terminal;
a pass gate comprising a first terminal coupled to the input node, a second terminal coupled to the output node, and a gate coupled to the output terminal of the second capacitor;
a diode comprising a first terminal coupled to the input node and a second terminal coupled to the output terminal of the second capacitor;
wherein the input node for the boost stage is coupled to an output node of another boost stage in the plurality of boost stages or to a source providing the input voltage; and
wherein the output node for the boost stage is coupled to an input node of another boost stage in the plurality of boost stages or provides the output voltage.

12. The charge pump of claim 11, further comprising:

a boost gate comprising a first terminal coupled to the input node, a second terminal coupled to the output terminal of the second capacitor, and a gate coupled to the output node.

13. The charge pump of claim 11, wherein each of the plurality of boost stages further comprises:

a precharge gate comprising a first terminal coupled to a precharge voltage source, a gate coupled to the first terminal, and a second terminal coupled to the output node.

14. A charge pump for receiving an input voltage and generating an output voltage, the charge pump comprising:

a clock doubling circuit for receiving a first clock signal and generating a second clock signal, wherein the second clock signal has the same frequency and phase as the first clock signal and double the amplitude of the first clock signal; and
a plurality of boost stages, each of the plurality of boost stages comprising:
an input node for the boost stage;
an output node for the boost stage;
a first capacitor comprising an input terminal for receiving the first clock signal and an output terminal coupled to the input node;
a second capacitor comprising an input terminal for receiving the second clock signal and an output terminal;
a pass gate comprising a first terminal coupled to the input node, a second terminal coupled to the output node, and a gate coupled to the output terminal of the second capacitor; and
a boost gate comprising a first terminal coupled to the input node, a second terminal coupled to the output terminal of the second capacitor, and a gate coupled to the output node;
wherein the input node for the boost stage is coupled to an output node of another boost stage in the plurality of boost stages or to a source providing the input voltage; and
wherein the output node for the boost stage is coupled to an input node of another boost stage in the plurality of boost stages or provides the output voltage.

15. The charge pump of claim 14, wherein each of the plurality of boost stages further comprises:

a precharge gate comprising a first terminal coupled to a precharge voltage source, a gate coupled to the first terminal, and a second terminal coupled to the output node.

16. The charge pump of claim 14, wherein the clock doubling circuit comprises:
   an inverter configured to receive the first clock signal and to generate an inverter output;
   a capacitor comprising a first terminal for receiving the inverter output and a second terminal for generating a capacitor output;
   an NMOS transistor comprising a gate configured to receive the first clock signal, a first terminal connected to an output node, and a second terminal connected to ground;
   a first PMOS transistor comprising a gate configured to receive the first clock signal, a first terminal connected to the second terminal of the capacitor, and a second terminal connected to the output node;
   a second PMOS transistor comprising a gate coupled to the output node, a first terminal connected to a voltage source, and a second terminal connected to the second terminal of the capacitor;
   wherein the second clock signal is generated on the output node.

17. A charge pump for receiving an input voltage and generating an output voltage, the charge pump comprising:
   a first clock doubling circuit for receiving a first clock signal and generating a second clock signal, wherein the second clock signal has the same frequency and phase as the first clock signal and double the amplitude of the first clock signal;
   a second clock doubling circuit for receiving a third clock signal and generating a fourth clock signal, wherein the fourth clock signal has the same frequency and phase as the third clock signal and double the amplitude of the third clock signal;
   N boost stages of a first type, each of the N boost stages comprising:
      an input node for the boost stage;
      an output node for the boost stage;
      a first capacitor comprising an input terminal for receiving the first clock signal and an output terminal coupled to the input node;
      a second capacitor comprising an input terminal for receiving the second clock signal and an output terminal;
      a pass gate comprising a first terminal coupled to the input node, a second terminal coupled to the output node, and a gate coupled to the output terminal of the second capacitor;
      a boost gate comprising a first terminal coupled to the input node, a second terminal coupled to the output terminal of the second capacitor, and a gate coupled to the output node;
      wherein the input node for the boost stage is coupled to an output node of another boost stage in the N boost stages or to a source providing the input voltage; and
      wherein the output node for the boost stage is coupled to an input node of another boost stage in the N boost stages or a boost stage in the M boost stages;
   M boost stages of a second type, each of the M boost stages comprising:
      an input node for the boost stage;
      an output node for the boost stage;
      a first capacitor comprising an input terminal for receiving the third clock signal and an output terminal coupled to the input node;
      a second capacitor comprising an input terminal for receiving a fourth clock signal and an output terminal;
      a pass gate comprising a first terminal coupled to the input node, a second terminal coupled to the output node, and a gate coupled to the output terminal of the second capacitor;
      a boost gate comprising a first terminal coupled to the input node, a second terminal coupled to the output terminal of the second capacitor, and a gate coupled to the output node;
      wherein the input node for the boost stage is coupled to an output node of another boost stage in the M boost stages or to an output node of a boost stage in the N boost stages; and
      wherein the output node for the boost stage is coupled to an input node of another boost stage in the M boost stages or provides the output voltage.

18. The charge pump of claim 17, wherein each of the N boost stages and each of the M boost stages further comprises:
   a precharge gate comprising a first terminal coupled to a precharge voltage source, a gate coupled to the first terminal, and a second terminal coupled to the output node.

19. A charge pump for receiving an input voltage and generating an output voltage, the charge pump comprising:
   N boost stages of a first type, each of the N boost stages comprising:
      an input node for the boost stage;
      an output node for the boost stage;
      a first capacitor comprising an input terminal for receiving a first clock signal and an output terminal coupled to the input node;
      a second capacitor comprising an input terminal for receiving a second clock signal and an output terminal;
      a pass gate comprising a transistor of a first conductivity type, the transistor comprising a first terminal coupled to the input node, a second terminal coupled to the output node, and a gate coupled to the output terminal of the second capacitor;
      a boost gate comprising a transistor of the first conductivity type, the transistor comprising a first terminal coupled to the input node, a second terminal coupled to the output terminal of the second capacitor, and a gate coupled to the output node;
      wherein the input node for the boost stage is coupled to an output node of another boost stage in the N boost stages or to a source providing the input voltage; and
      wherein the output node for the boost stage is coupled to an input node of another boost stage in the N boost stages or a boost stage in the M boost stages;
   M boost stages of a second type, each of the M boost stages comprising:
      an input node for the boost stage;
      an output node for the boost stage;
      a first capacitor comprising an input terminal for receiving a first clock signal and an output terminal coupled to the input node;
      a second capacitor comprising an input terminal for receiving a second clock signal and an output terminal;

a pass gate comprising a transistor of a second conductivity type, the transistor comprising a first terminal coupled to the input node, a second terminal coupled to the output node, and a gate coupled to the output terminal of the second capacitor;

a boost gate comprising a transistor of a second conductivity type, the transistor comprising a first terminal coupled to the input node, a second terminal coupled to the output terminal of the second capacitor, and a gate coupled to the output node;

wherein the input node for the boost stage is coupled to an output node of another boost stage in the M boost stages or to an output node of a boost stage in the N boost stages; and wherein the output node for the boost stage is coupled to an input node of another boost stage in the M boost stages or provides the output voltage.

20. The charge pump of claim 19, wherein each of the N boost stages and each of the M boost stages further comprises:

a precharge gate comprising a first terminal coupled to a precharge voltage source, a gate coupled to the first terminal, and a second terminal coupled to the output node.

21. The charge pump of claim 19, wherein the first conductivity type is p-channel and the second conductivity type is n-channel.

22. The charge pump of claim 19, wherein the first conductivity type is n-channel and the second conductivity type is p-channel.

23. The charge pump of claim 20, wherein the first conductivity type is p-channel and the second conductivity type is n-channel.

24. The charge pump of claim 20, wherein the first conductivity type is n-channel and the second conductivity type is p-channel.

* * * * *